United States Patent
Zhong et al.

(10) Patent No.: US 12,550,633 B2
(45) Date of Patent: Feb. 10, 2026

(54) DIFFUSION BARRIER TO MITIGATE DIRECT-SHORTAGE LEAKAGE IN CONDUCTIVE BRIDGING RAM (CBRAM)

(71) Applicant: Taiwan Semiconductor Manufacturing Company, Ltd., Hsinchu (TW)

(72) Inventors: Chia-Wen Zhong, Taichung (TW); Yen-Liang Lin, Yilan County (TW); Yao-Wen Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 648 days.

(21) Appl. No.: 17/693,983

(22) Filed: Mar. 14, 2022

(65) Prior Publication Data
US 2023/0134560 A1   May 4, 2023

Related U.S. Application Data

(60) Provisional application No. 63/300,333, filed on Jan. 18, 2022, provisional application No. 63/273,380, filed on Oct. 29, 2021.

(51) Int. Cl.
*H10N 70/00*    (2023.01)
*H10B 63/00*    (2023.01)
*H10N 70/20*    (2023.01)

(52) U.S. Cl.
CPC ......... *H10N 70/8616* (2023.02); *H10B 63/30* (2023.02); *H10N 70/063* (2023.02); *H10N 70/245* (2023.02); *H10N 70/841* (2023.02)

(58) Field of Classification Search
CPC ............ H10N 70/8616; H10N 70/063; H10N 70/245; H10N 70/841; H10N 70/826; H10N 70/883; H10N 70/8833; H10N 70/011; H10N 70/821; H10B 63/30; H10B 63/20; H10B 63/84
See application file for complete search history.

(56) References Cited

U.S. PATENT DOCUMENTS

| | | | |
|---|---|---|---|
| 9,324,942 B1 * | 4/2016 | Nazarian | H10N 70/884 |
| 2006/0183327 A1 * | 8/2006 | Moon | H01L 21/76856 438/687 |
| 2015/0021540 A1 * | 1/2015 | Xie | H01L 21/0228 257/4 |
| 2015/0090947 A1 * | 4/2015 | Marsh | H10N 70/245 257/2 |
| 2015/0123065 A1 | 5/2015 | Petz et al. | |

(Continued)

*Primary Examiner* — Fernando L Toledo
*Assistant Examiner* — Marshall Mu-Nuo Hatfield
(74) *Attorney, Agent, or Firm* — Eschweiler & Potashnik, LLC

(57) ABSTRACT

The present disclosure relates an integrated chip structure. The integrated chip structure includes a bottom electrode disposed within a dielectric structure over a substrate. A top electrode is disposed within the dielectric structure over the bottom electrode. A switching layer and an ion source layer are between the bottom electrode and the top electrode. A barrier structure is between the bottom electrode and the top electrode. The barrier structure includes a metal nitride configured to mitigate a thermal diffusion of metal during a high temperature fabrication process.

20 Claims, 14 Drawing Sheets

(56) References Cited

U.S. PATENT DOCUMENTS

| | | | |
|---|---|---|---|
| 2015/0162529 A1* | 6/2015 | Lee | H10N 70/841 |
| | | | 711/147 |
| 2016/0172420 A1* | 6/2016 | Bajaj | H10B 63/20 |
| | | | 257/4 |
| 2017/0133434 A1 | 5/2017 | Ueki et al. | |
| 2017/0141300 A1* | 5/2017 | Trinh | H10N 70/826 |
| 2017/0162783 A1* | 6/2017 | Narayanan | H10N 70/245 |
| 2018/0204881 A1* | 7/2018 | Sei | H10B 63/84 |
| 2018/0212143 A1* | 7/2018 | Tseng | H10N 70/826 |
| 2019/0305218 A1* | 10/2019 | Trinh | H10N 70/826 |
| 2020/0052203 A1* | 2/2020 | Trinh | H10N 70/24 |
| 2020/0343445 A1* | 10/2020 | Strutt | H10N 70/24 |
| 2020/0388755 A1 | 12/2020 | Chang et al. | |
| 2021/0280780 A1 | 9/2021 | Zhong et al. | |
| 2021/0305357 A1 | 9/2021 | Huang et al. | |
| 2022/0320429 A1* | 10/2022 | Narayanan | H10N 70/826 |

\* cited by examiner

DIFFUSION BARRIER TO MITIGATE DIRECT-SHORTAGE LEAKAGE IN CONDUCTIVE BRIDGING RAM (CBRAM)

REFERENCE TO RELATED APPLICATIONS

This Application claims the benefit of U.S. Provisional Application No. 63/273,380, filed on Oct. 29, 2021 & U.S. Provisional Application No. 63/300,333, filed on Jan. 18, 2022. The contents of the above-referenced Patent Applications are hereby incorporated by reference in their entirety.

BACKGROUND

Many modern day electronic devices contain memory configured to digitally store data. Memory in electronic devices may be volatile memory or non-volatile memory. Volatile memory stores data when it is powered, while non-volatile memory is able to store data when power is removed. Conductive-bridging random-access memory (CBRAM) is one promising candidate for a next generation non-volatile memory technology because it is able to operate at high speed, with low power, and can be fabricated by a process that is compatible with existing CMOS fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
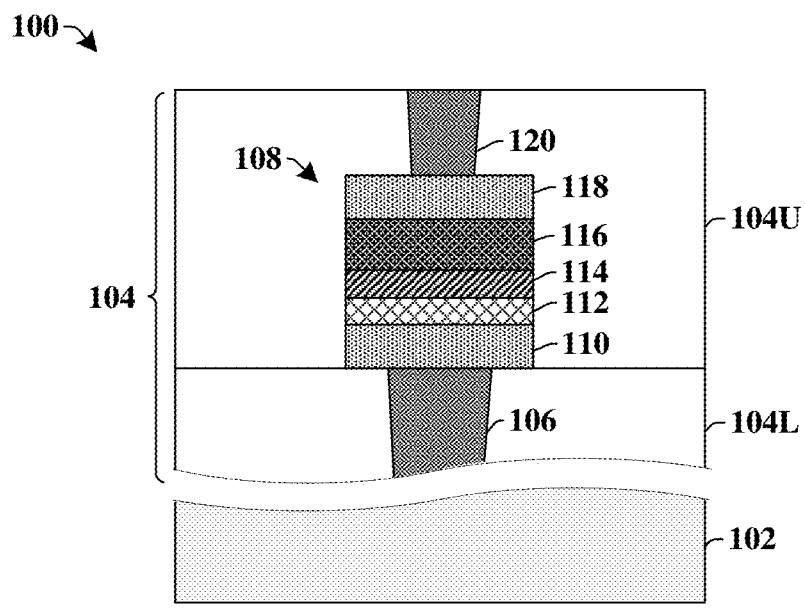
FIG. 1 illustrates a cross-sectional view of some embodiments of an integrated chip structure comprising a conductive bridging random access memory (CBRAM) device having a barrier structure configured to reduce metal diffusion due to high temperature fabrication processes.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A conductive bridging random access memory (CBRAM) device typically comprises an ion source layer (ISL) and a switching layer (SL) arranged between a first electrode and a second electrode. The CBRAM device operates by selectively forming and dissolving a conductive filament of metallic ions within the switching layer to switch between resistive states. When the conductive filament is present within the switching layer, the CBRAM device has a first resistance corresponding to a first data state (e.g., a logical "1"). When the conductive filament is not present within the switching layer, the CBRAM device has a second resistance corresponding to a second data state (e.g., a logical "0").

For example, during a set operation a first bias voltage that is applied to the first and/or second electrodes will cause metal ions to drift from the ion source layer to the switching layer to form a conductive filament extending through the switching layer and give the CBRAM device a first resistance (e.g., a low resistance state). During a reset operation a polarity of the bias voltage is changed and metal ions are driven from the switching layer back into the ion source layer, thereby dissolving the conductive filament and changing the CBRAM device from the first resistance to a second resistance (e.g., a high resistance state).

During fabrication, a CBRAM device may be exposed to high temperature processes (e.g., bonding processes, soldering processes, or the like). It has been appreciated that during such high temperature processes, metal (e.g., metal ions and/or metal atoms) in the ion source layer may thermally diffuse into the switching layer. The thermal diffusion of metal into the switching layer can cause unwanted metal to be present within the switching layer without applying a bias voltage across the CBRAM device. The unwanted metal can cause leakage between the top electrode and the bottom electrode and/or even CBRAM device failure (e.g., the unwanted metal may form an unwanted conductive bridge within the switching layer so that switching between resistive states is not possible).

The present disclosure relates to an integrated chip structure comprising a CBRAM device having a barrier structure configured to prevent a thermal diffusion of metal into a switching layer during high temperature fabrication processes (e.g., the barrier structure may prevent a short current issue caused by ion migration in the thermal process of back-end-of-the-line (BEOL)). In some embodiments, the integrated chip structure may comprise a bottom electrode and a top electrode disposed within a dielectric structure over a substrate. A switching layer and an ion source layer are between the bottom electrode and the top electrode. A barrier structure is disposed between the switching layer and the ion source layer. The barrier structure is configured to mitigate a thermal diffusion of metal (e.g., metal ions) between the ion source layer and the switching layer during high temperature processes that may occur during fabrication of the integrated chip structure. By mitigating a thermal diffusion of metal during high temperature fabrication processes, the barrier structure is able to prevent unwanted metal within the switching layer and improve CBRAM device performance and/or yield. For example, according to a wafer accept test (WAT), the barrier structure can prevent and/or reduce leakage currents between the top and bottom electrodes.

FIG. 1 illustrates a cross-sectional view of some embodiments of an integrated chip structure 100 comprising a conductive bridging random access memory (CBRAM) device having a barrier structure configured to reduce metal diffusion due to high temperature fabrication processes.

The integrated chip structure 100 comprises a conductive bridging random access memory (CBRAM) device 108 disposed within a dielectric structure 104 over a substrate 102. The dielectric structure 104 comprises a plurality of stacked inter-level dielectric (ILD) layers. In some embodiments, the plurality of stacked ILD layers may comprise a lower ILD structure 104L arranged between the CBRAM device 108 and the substrate 102, and an upper ILD structure 104U surrounding the CBRAM device 108. In some embodiments, the lower ILD structure 104L comprises one or more lower ILD layers surrounding one or more lower interconnects 106 arranged below the CBRAM device 108.

The CBRAM device 108 comprises a switching layer 112 and an ion source layer 116 arranged between a bottom electrode 110 and a top electrode 118. During operation, a bias voltage will cause metal (e.g., metal ions such as silver ions, copper ions, aluminum ions, etc.) to move between the ion source layer 116 and the switching layer 112, so as to selectively form and/or dissolve a conductive filament (e.g., a conductive bridge) within the switching layer 112. For example, when a first bias voltage is applied across the CBRAM device 108, metal ions will move from the ion source layer 116 to the switching layer 112 to form a conductive filament within the switching layer 112 and give the CBRAM device 108 a first resistance (e.g., a low resistance state corresponding to a first data state). Alternatively, when a second bias voltage is applied across the CBRAM device 108, metal ions will move from the switching layer 112 back to the ion source layer 116 and give the CBRAM device 108 a second resistance (e.g., a high resistance state corresponding to a second data state).

The CBRAM device 108 also comprises a barrier structure 114 arranged between the bottom electrode 110 and the top electrode 118. The barrier structure 114 is configured to mitigate the thermal diffusion of metal (e.g., metal ions). In some embodiments, the barrier structure 114 may be arranged between the switching layer 112 and the ion source layer 116. In such embodiments, the barrier structure 114 may be configured to mitigate the thermal diffusion of metal from the ion source layer 116 to the switching layer 112 during high temperature processes (e.g., fabrication processes performed at a temperature of greater than or equal to approximately 300° C., approximately 400° C., approximately 500° C., or other similar temperatures) used in the fabrication of an integrated chip structure (e.g., an integrated chip). By mitigating the thermal diffusion of metal from the ion source layer 116 to the switching layer 112 during high temperature processes, the formation of unwanted metal (e.g., an unwanted conductive filament) within the switching layer 112 can be avoided thereby improving performance and/or yield of the CBRAM device 108.

Figure 2A:
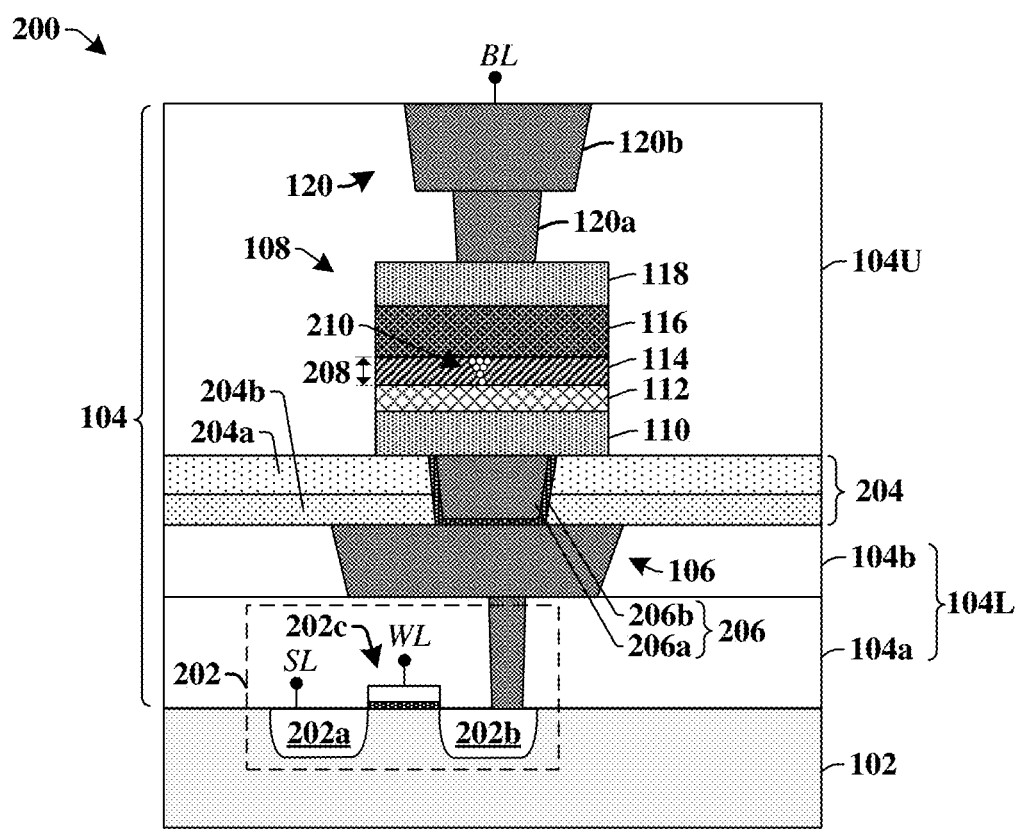
FIGS. 2A-2B illustrate some additional embodiments of an integrated chip structure comprising a CBRAM device having a barrier structure configured to reduce metal diffusion.

FIG. 2A illustrates a cross-sectional view of some additional embodiments of an integrated chip 200 comprising a CBRAM device having a barrier structure configured to reduce metal diffusion.

The integrated chip 200 comprises a CBRAM device 108 disposed within a dielectric structure 104 over a substrate 102. In some embodiments, the dielectric structure 104 comprises a lower ILD structure 104L and an upper ILD structure 104U over the lower ILD structure 104L. The lower ILD structure 104L comprises one or more lower ILD layers 104a-104b laterally surrounding one or more lower interconnects 106. In some embodiments, the lower ILD structure 104L may comprise a first lower ILD layer 104a and a second lower ILD layer 104b. In some embodiments, the one or more lower interconnects 106 may comprise conductive contacts, interconnect wires, and/or interconnect vias. The upper ILD structure 104U laterally surrounds the CBRAM device 108. In some embodiments, the lower ILD structure 104L and/or the upper ILD structure 104U may comprise one or more of silicon dioxide, carbon doped silicon oxide (SiCOH), phosphosilicate glass (PSG), borophosphosilicate glass (BPSG), fluorosilicate glass (FSG), undoped silicate glass (USG), or the like. In some embodiments, the one or more lower interconnects 106 may comprise one or more of copper, aluminum, tungsten, ruthenium, or the like.

In some embodiments, the one or more lower interconnects 106 are configured to couple the CBRAM device 108 to an access device 202 disposed within the substrate 102. In some embodiments, the access device 202 may comprise a MOSFET device having a gate structure 202c that is laterally arranged between a source region 202a and a drain region 202b. In some embodiments, the gate structure 202c may comprise a gate electrode that is separated from the substrate 102 by a gate dielectric. In some such embodiments, the source region 202a is coupled to a source-line SL and the gate structure 202c is coupled to a word-line WL. In various embodiments, the MOSFET device may comprise a planar FET, a FinFET, a gate-all-around (GAA) device, or the like. In other embodiments, the access device 202 may comprise a HEMT (high-electron-mobility transistor), a BJT (bipolar junction transistor), a JFET (junction-gate field-effect transistor), or the like.

A lower insulating structure 204 is arranged over the lower ILD structure 104L. The lower insulating structure 204 comprises sidewalls that define an opening extending through the lower insulating structure 204. In some embodiments, the lower insulating structure 204 may comprise a first dielectric layer 204a and a second dielectric layer 204b over the first dielectric layer 204a. In some embodiments, the first dielectric layer 204a may comprise a different material than the second dielectric layer 204b. In various embodiments the first dielectric layer 204a may comprise silicon rich oxide, silicon carbide, silicon dioxide, silicon nitride, or the like, while the second dielectric layer 204b may comprise silicon carbide, silicon nitride, silicon dioxide, or the like.

A bottom electrode via 206 is arranged between the sidewalls of the lower insulating structure 204. The bottom electrode via 206 extends from one of the lower interconnects 106 to a top of the lower insulating structure 204. In some embodiments, the bottom electrode via 206 may comprise a barrier layer 206a and a conductive core 206b surrounded by the barrier layer 206a. In some embodiments, the barrier layer 206a may comprise one or more of titanium, titanium nitride, tantalum, tantalum nitride, or the like. In some embodiments, the conductive core 206b may comprise one or more of aluminum, copper, tungsten, titanium, titanium nitride, tantalum, tantalum nitride, or the like.

The CBRAM device 108 is arranged on the bottom electrode via 206. In some embodiments, the CBRAM device 108 comprises a bottom electrode 110 that is separated from a top electrode 118 by way of a switching layer 112 and an ion source layer 116. In some embodiments, the bottom electrode 110 and the top electrode 118 may comprise a metal, such as tantalum, titanium, tantalum nitride, titanium nitride, platinum, nickel, hafnium, zirconium, ruthenium, iridium, or the like. In some embodiments, the bottom electrode 110 may have a first work function (e.g., approximately 4.2 eV) and the top electrode 118 may have a second work function (e.g., approximately 4.15 eV) that is less than the first work function. In some embodiments, the switching layer 112 may comprise an oxide, a nitride, or the like. For example, in some embodiments, the switching layer 112 may comprise a metal oxide, a chalcogenide, silicon nitride, hafnium oxide, aluminum oxide, tantalum oxide, titanium oxide, aluminum oxide, silicon oxide, or the like. In some embodiments, the ion source layer 116 may comprise copper, silver, aluminum, or the like.

The CBRAM device 108 further comprises a barrier structure 114 arranged between the bottom electrode 110 and the top electrode 118. In some embodiments, the barrier structure 114 has a lower surface contacting the switching layer 112 and an upper surface contacting the ion source layer 116. In some embodiments, the barrier structure 114 comprises a nitride and/or a metal nitride. For example, in various embodiments the barrier structure 114 may comprise titanium nitride, amorphous titanium nitride, tantalum nitride, tungsten nitride, aluminum nitride, silicon nitride, tungsten nitride, ceramic aluminum nitride or the like. In some embodiments, the barrier structure 114 may have a thickness 208 of less than or equal to approximately 75 Angstroms (Å), less than or equal to approximately 50 Å, less than or equal to approximately 40 Å, or other similar values. If the thickness 208 of the barrier structure 114 is too large (e.g., greater than approximately 75 Å, greater than approximately 50 Å, or other similar values), the barrier structure 114 may impede movement of metal ions during operation of the CBRAM device 108 thereby negatively impacting operation of the CBRAM device 108.

A first conductive filament 210 (e.g., a conductive bridge) extends through the barrier structure 114. The first conductive filament 210 comprises a plurality of metal ions (e.g., gold ions, copper ions, aluminum ions, or the like) continuously extending from a top surface of the barrier structure 114 to a bottom surface of the barrier structure 114. In some embodiments, the a first conductive filament 210 extends through the barrier structure 114 during storage of a first data state and a second data state, while a second conductive filament (not shown) is present in the switching layer 112 during storage of one of either the first data state or the second data state.

An upper interconnect structure 120 is arranged within the upper ILD structure 104U and is coupled to the top electrode 118. The upper interconnect structure 120 may comprise an interconnect via 120a and/or an interconnect wire 120b. In some embodiments, the upper interconnect structure 120 may comprise aluminum, copper, tungsten, or the like. In some embodiments, the upper interconnect structure 120 is further coupled to a bit-line BL.

Figure 2B:
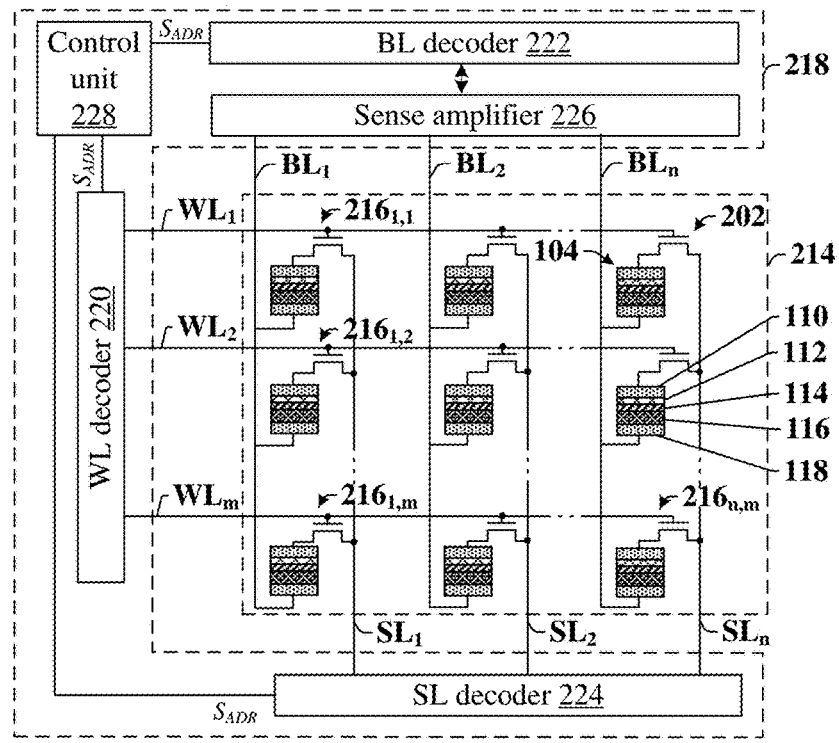

FIG. 2B illustrates a schematic diagram of some embodiments of a memory circuit 212 comprising a disclosed CBRAM device.

The memory circuit 212 comprises a memory array 214 including a plurality of CBRAM memory cells $216_{1,1}$-$216_{n,m}$. The plurality of CBRAM memory cells $216_{1,1}$-$216_{n,m}$ are arranged within the memory array 214 in rows and/or columns. The plurality of CBRAM memory cells $216_{x,1}$-$216_{x,m}$ within a row are operably coupled to word-lines $WL_x$ (x=1-m). The plurality of CBRAM memory cells $216_{x,1}$-$216_{x,m}$ within a column are operably coupled to bit-lines $BL_x$ (x=1-n) and source-lines $SL_x$ (x=1-n).

The word-lines $WL_1$-$WL_m$, the bit-lines $BL_1$-$BL_n$, and the source-lines $SL_1$-$SL_n$ are coupled to control circuitry 218. In some embodiments, the control circuitry 218 comprises a word-line decoder 220 coupled to the word-lines $WL_1$-$WL_m$, a bit-line decoder 222 coupled to the bit-lines $BL_1$-$BL_n$, and a source-line decoder 224 coupled to the source-lines $SL_1$-$SL_n$. In some embodiments, the control circuitry 218 further comprises a sense amplifier 226 coupled to the bit-lines $BL_1$-$BL_n$ or the source-lines $SL_1$-$SL_n$. In some embodiments, the control circuitry 218 further comprises a control unit 228 configured to send address information $S_{ADR}$ to the word-line decoder 220, the bit-line decoder 222, and/or the source-line decoder 224 to enable the control circuitry 218 to selectively access one or more of the plurality of CBRAM memory cells $216_{1,1}$-$216_{n,m}$.

For example, during operation the control circuitry 218 is configured to provide address information $S_{ADR}$ to the word-line decoder 220, the bit-line decoder 222, and the source-line decoder 224. Based on the address information $S_{ADR}$, the word-line decoder 220 is configured to selectively apply a bias voltage to one of the word-lines $WL_1$-$WL_m$. Concurrently, the bit-line decoder 222 is configured to selectively apply a bias voltage to one of the bit-lines $BL_1$-$BL_n$ and/or the source-line decoder 224 is configured to selectively apply a bias voltage to one of the source-lines $SL_1$-$SL_n$. By applying bias voltages to selective ones of the word-lines $WL_1$-$WL_m$, the bit-lines $BL_1$-$BL_n$, and/or the source-lines $SL_1$-$SL_n$, the memory circuit 212 can be operated to write different data states to and/or read data states from the plurality of CBRAM memory cells $216_{1,1}$-$216_{n,m}$.

Figure 3A:
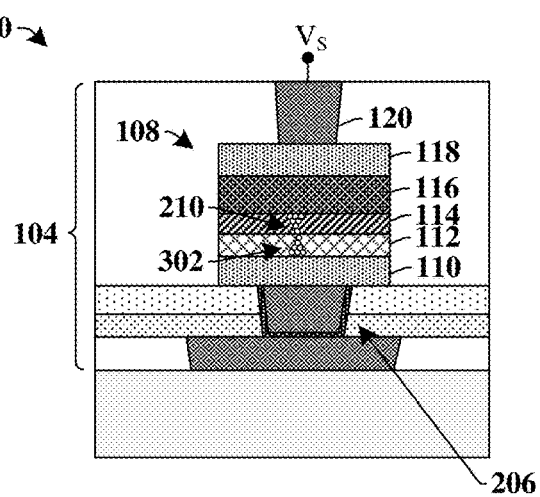
FIGS. 3A-3B illustrate cross-sectional views of some embodiments showing operation of a CBRAM device having a barrier structure configured to reduce metal diffusion.
Figure 3B:
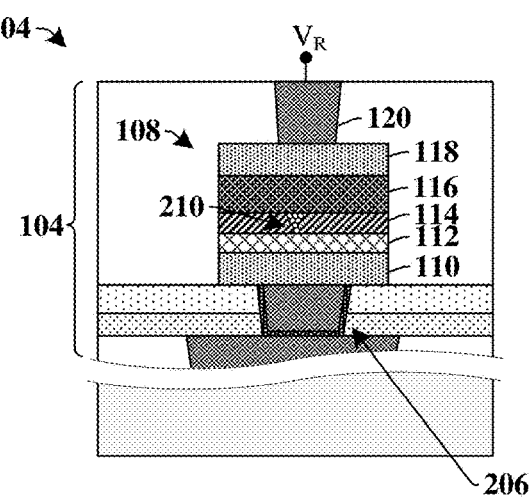

FIGS. 3A-3B illustrate cross-sectional views of some embodiments showing operation of a CBRAM device having a barrier structure configured to reduce metal diffusion.

FIG. 3A illustrates a cross-sectional view 300 of a CBRAM device 108 during a set operation. During the set operation, a set voltage $V_S$ is applied across a bottom electrode 110 and a top electrode 118 of the CBRAM device 108 (e.g., via a bottom electrode via 206 and an upper interconnect structure 120). A first conductive filament 210 (e.g., a first conductive bridge) is present within a barrier structure 114 disposed between a switching layer 112 and an ion source layer 116. The set voltage $V_S$ causes metal ions to travel from the ion source layer 116 to the switching layer 112, thereby forming second conductive filament 302 (e.g., a second conductive bridge) within the switching layer 112. The first conductive filament 210 and the second conductive filament 302 collectively extend between a top surface of the barrier structure 114 and a bottom surface of the switching layer 112. Because the first conductive filament 210 and the second conductive filament 302 collectively extend through the barrier structure 114 and the switching layer 112, a conductive path is present through the barrier structure 114 and the switching layer 112 thereby giving the CBRAM device 108 a first resistance that corresponds to a first data state (e.g., a logical "1").

FIG. 3B illustrates a cross-sectional view 304 of the CBRAM device 108 during a reset operation. During the reset operation, a reset voltage $V_R$ is applied across the bottom electrode 110 and the top electrode 118. The reset voltage $V_R$ causes metal ions to travel from switching layer 112 to the ion source layer 116, thereby at least partially dissolving the second conductive filament (302 of FIG. 3A) within the switching layer 112 without removing the first conductive filament 210. Because at least a part of the second conductive filament 302 is removed, a conductive path is not present through the barrier structure 114 and the switching layer 112 thereby giving the CBRAM device 108 a second resistance that corresponds to a second data state (e.g., a logical "0").

Figure 4A:
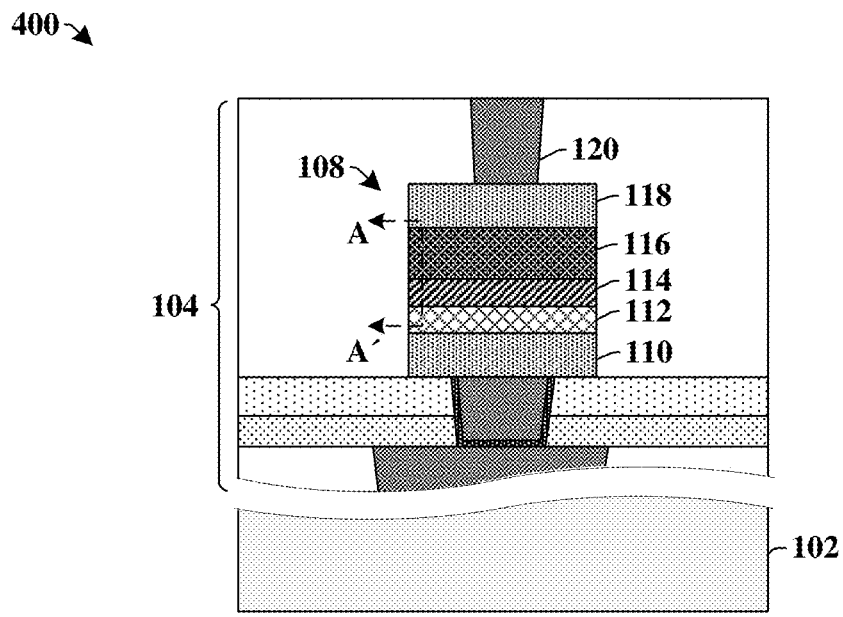
FIGS. 4A-4B illustrate some additional embodiments of an integrated chip structure comprising a CBRAM device having a barrier structure configured to reduce metal diffusion.
Figure 4B:
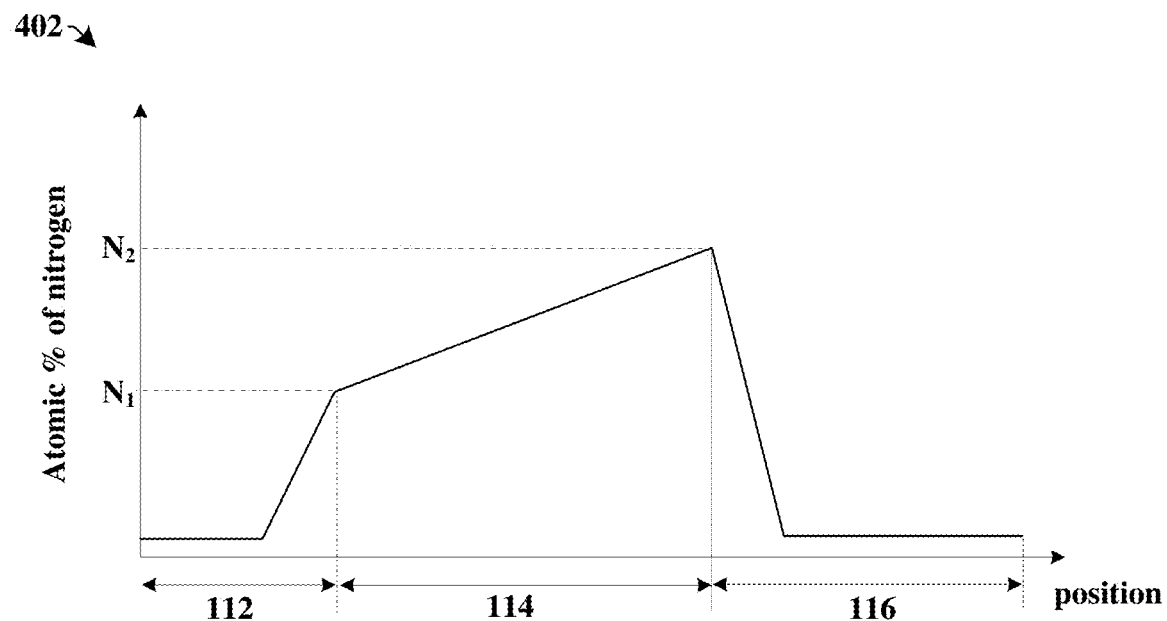

FIGS. 4A-4B illustrates some additional embodiments of an integrated chip structure comprising a CBRAM device having a barrier structure configured to reduce metal diffusion.

FIG. 4A illustrates a cross-sectional view of an integrated chip 400 comprising a CBRAM device 108 disposed within a dielectric structure 104 over a substrate 102. The CBRAM device 108 comprises a switching layer 112 and an ion source layer 116 disposed between a bottom electrode 110 and a top electrode 118. A barrier structure 114 is between the switching layer 112 and the ion source layer 116. The barrier structure 114 comprises a metal nitride configured to mitigate a thermal diffusion of metal (e.g., metal ions) between the switching layer 112 and the ion source layer 116. In some embodiments, the barrier structure 114 may comprise a ratio of nitrogen to metal that is less than 1, less than approximately 70%, between approximately 70% and approximately 40%, or other similar values. For example, the barrier structure 114 may comprise a ratio of an atomic percentage of nitrogen to an atomic percentage of aluminum that is between approximately 40% and approximately 70%.

In some embodiments, the barrier structure 114 comprises a gradient nitrogen content (e.g., doping concentration, atomic percentage, or the like) that continuously changes over a height of the barrier structure 114. For example, FIG. 4B illustrates a graph 402 showing an atomic percent of nitrogen within the barrier structure (on y-axis) as a function of position within the CBRAM device (x-axis). As shown in graph 402 (taken along line A-A' of FIG. 4A), the barrier structure 114 has a first nitrogen content $N_1$ along a bottom surface of the barrier structure 114 and a second nitrogen content $N_2$ along a top surface of the barrier structure 114. In some embodiments, the first nitrogen content $N_1$ is smaller than the second nitrogen content $N_2$. In some embodiments, the nitrogen content continuously changes (e.g., increases) between the first nitrogen content $N_1$ and the second nitrogen content $N_2$.

Figure 5:
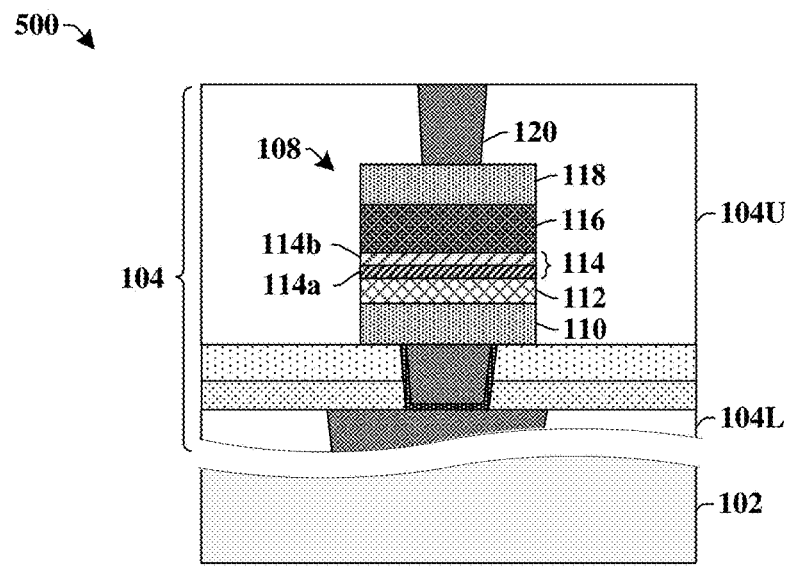
FIGS. 5-7D illustrate some additional embodiments of integrated chip structures comprising a CBRAM device having a barrier structure configured to reduce metal diffusion.

FIG. 5 illustrates a cross-sectional view of some additional embodiments of an integrated chip structure 500 comprising a CBRAM device having a multilayer barrier structure.

The integrated chip structure 500 comprises a CBRAM device 108 disposed within a dielectric structure 104 over a substrate 102. The CBRAM device 108 comprises a switching layer 112 and an ion source layer 116 disposed between a bottom electrode 110 and a top electrode 118. A barrier structure 114 is between the switching layer 112 and the ion source layer 116. In some embodiments, the barrier structure 114 comprises a plurality of barrier layers 114a-114b stacked onto one another. The plurality of barrier layers 114a-114b have different nitrogen contents (e.g., doping concentrations, atomic percentages, or the like) so as to give the barrier structure 114 a plurality of discrete (e.g., discontinuous) nitrogen contents over a height of the barrier structure 114. In some embodiments, a first barrier layer 114a along a bottom surface of the barrier structure 114 has a first nitrogen content that is greater than a second nitrogen content of a second barrier layer 114b along a top surface of the barrier structure 114. In some embodiments, the plurality of barrier layers 114a-114b may have gradient contents that are discontinuous with one another along an interface between adjacent ones of the plurality of barrier layers 114a-114b.

Figures 6A, 6B:
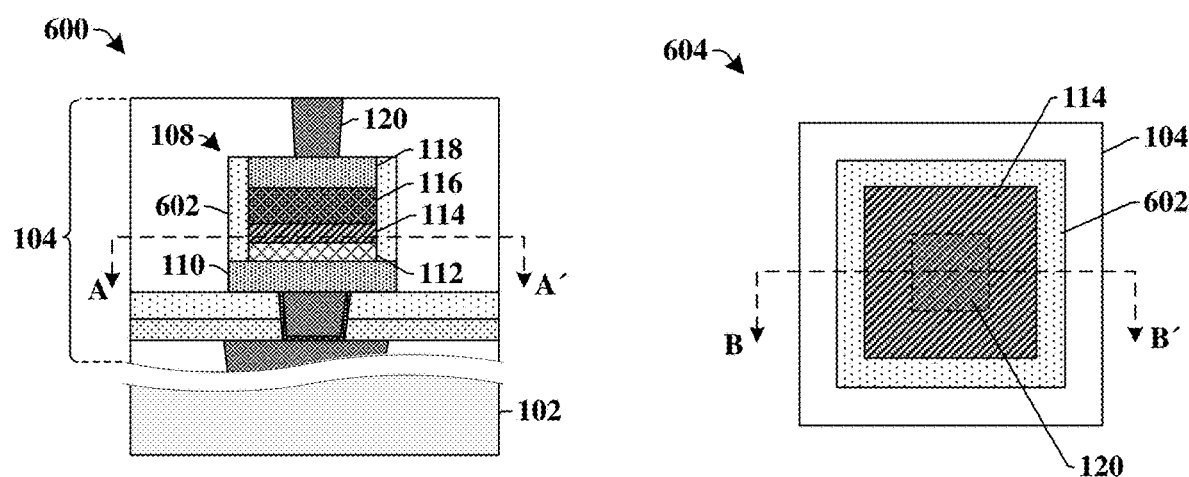

FIGS. 6A-6B illustrate some additional embodiments of integrated chip structure comprising a CBRAM device having a disclosed barrier structure.

FIG. 6A illustrates a cross-sectional view 600 of the integrated chip structure. As shown in cross-sectional view 600, the integrated chip structure comprises a CBRAM device 108 disposed within a dielectric structure 104 over a substrate 102. The CBRAM device 108 comprises a switching layer 112 and an ion source layer 116 disposed between a bottom electrode 110 and a top electrode 118. A barrier structure 114 is between the switching layer 112 and the ion source layer 116. One or more sidewall spacers 602 extend along outer sidewalls of the switching layer 112, the barrier structure 114, the ion source layer 116, and/or the top electrode 118. The one or more sidewall spacers 602 comprise a dielectric material (e.g., silicon oxide, silicon nitride, silicon carbide, or the like).

FIG. 6B illustrates a plan view 604 of the integrated chip structure taken along line A-A' of cross-sectional view 600. Cross-sectional view 600 is taken along line B-B' of plan view 604. As shown in plan view 604, the one or more sidewall spacers 602 wrap around an outer boundary of the barrier structure 114 and separate the barrier structure 114 from the dielectric structure 104.

Figure 7A:
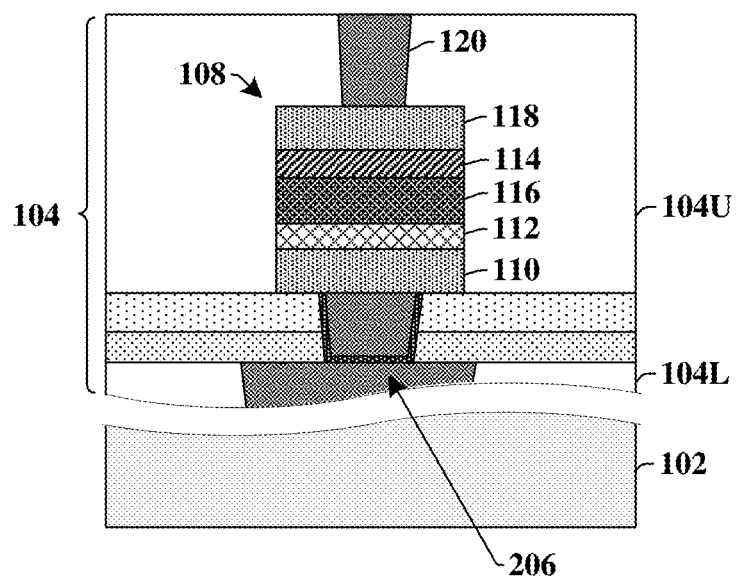
Figure 7B:
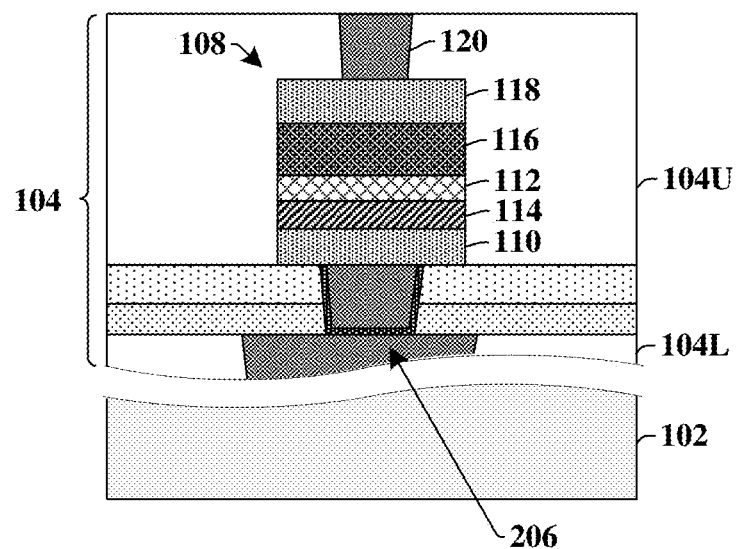
Figure 7C:
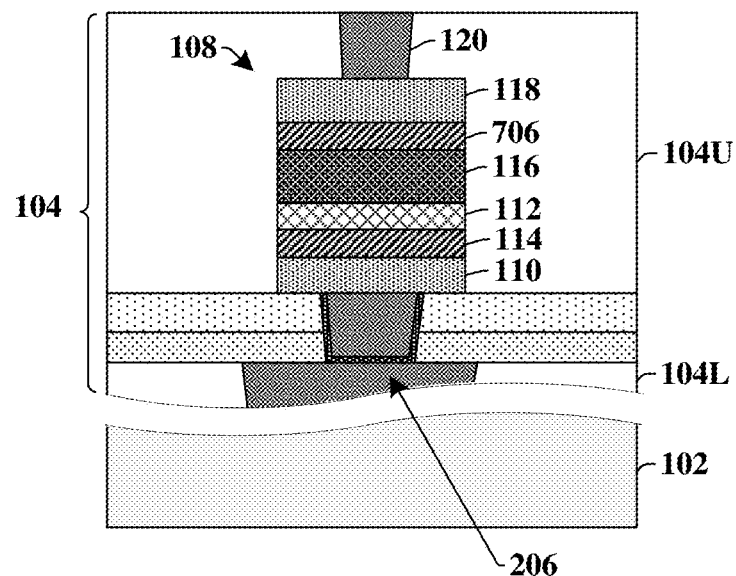

Although FIGS. 1-6B illustrate CBRAM devices having a single barrier structure disposed between a switching layer and an ion source layer, it will be appreciated that in various additional embodiments the barrier structure may be located at different positions within the disclosed CBRAM device and/or one or more additional barrier structures may be disposed within the CBRAM device. FIGS. 7A-7C illustrate cross-sectional views of some additional embodiments of integrated chip structures comprising a CBRAM device having one or more barrier structures between a top electrode and a bottom electrode.

FIG. 7A illustrates a cross-sectional view of an integrated chip 700 comprising a CBRAM device 108 having a barrier structure 114 disposed between a top electrode 118 and an upper surface of an ion source layer 116 that faces the top electrode 118. Without the barrier structure 114 in place, metal (e.g., metal atoms and/or metal ions) can thermally diffuse between the ion source layer 116 and top electrode 118, thereby increasing leakage within the CBRAM device 108. The barrier structure 114 is configured to prevent the thermal diffusion of metal between the ion source layer 116 and the top electrode 118, thereby mitigating leakage and/or CBRAM failure. In some embodiments, the barrier structure 114 may have a thickness 208 of less than approximately 75 Angstroms (Å), less than approximately 50 Å, less than approximately 40 Å, or other similar values.

FIG. 7B illustrates a cross-sectional view of an integrated chip 702 comprising a CBRAM device 108 having a barrier structure 114 disposed between a bottom electrode 110 and a lower surface of a switching layer 112 that faces the bottom electrode 110. Without the barrier structure 114 in place, metal (e.g., metal atoms and/or metal ions) can thermally diffuse between the ion source layer 116 and the bottom electrode 110, thereby increasing leakage within the CBRAM device 108. The barrier structure 114 is configured to prevent the thermal diffusion of metal between the ion source layer 116 and the bottom electrode 110, thereby mitigating leakage and/or failure of the CBRAM device 108.

FIG. 7C illustrates a cross-sectional view of an integrated chip 704 comprising a CBRAM device 108 having a barrier structure 114 disposed between a bottom electrode 110 and a lower surface of a switching layer 112 that faces the bottom electrode 110. In some embodiments, a first additional barrier structure 706 is disposed between a top electrode 118 and an upper surface of an ion source layer 116 that faces the top electrode 118. The first additional barrier structure 706 is configured to mitigate a thermal diffusion of metal (e.g., metal atoms and/or metal ions) between the ion source layer 116 and the top electrode 118.

Figure 7D:
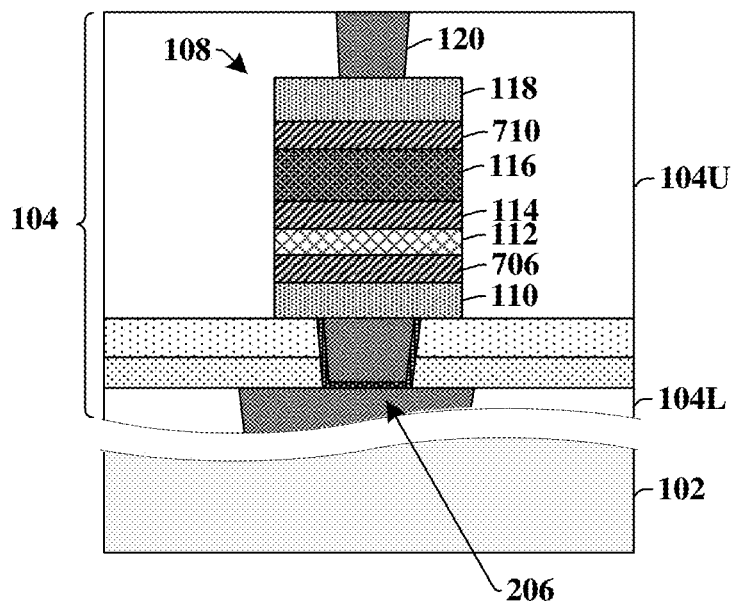

FIG. 7D illustrates a cross-sectional view of an integrated chip 708 comprising a CBRAM device 108 having a barrier structure 114 disposed between a switching layer 112 and an ion source layer 116. In some embodiments, a first additional barrier structure 706 is disposed between the bottom electrode 110 and the switching layer 112. The first additional barrier structure 706 is configured to mitigate a thermal diffusion of metal (e.g., metal atoms and/or metal ions) between the ion source layer 116 and the bottom electrode 110. In some embodiments, a second additional barrier structure 710 is disposed between the ion source layer 116 and the top electrode 118. The second additional barrier structure 710 is configured to mitigate a thermal diffusion of metal between the ion source layer 116 and the top electrode 118. In some alternative embodiments (not shown), the integrated chip may have the barrier structure 114 between the switching layer 112 and the ion source layer 116, the second additional barrier structure 710 between the ion source layer 116 and the top electrode 118, but not have the first additional barrier structure between the bottom electrode 110 and the switching layer 112. In some additional alternative embodiments, the integrated chip may have the barrier structure 114 between the switching layer 112 and the ion source layer 116, the first additional barrier structure 706 between the bottom electrode 110 and the switching layer 112, but not have the second additional barrier structure between the ion source layer 116 and the top electrode 118.

In some embodiments, the barrier structure 114, the first additional barrier structure 706, and the second additional barrier structure 710 may comprise a metal nitride. In some embodiments, barrier structure 114 may comprise a first metal nitride (e.g., aluminum nitride, silicon nitride, tungsten nitride, or the like) and the first additional barrier structure 706 and/or the second additional barrier structure 710 may comprise an addition metal nitride (e.g., titanium nitride, tantalum nitride, tungsten nitride, or the like) that is different than the first metal nitride. In some embodiments, the barrier structure 114 and the first additional barrier structure 706 and/or the second additional barrier structure 710 may have different contents of nitrogen. In some embodiments, the barrier structure 114 may have a different maximum nitrogen content than the first additional barrier structure 706 and/or the second additional barrier structure 710. For example, the barrier structure 114 may have a lower maximum nitrogen content than the first additional barrier structure 706 and/or the second additional barrier structure 710. In some embodiments, the barrier structure 114 has a first ratio of nitrogen to metal, the first additional barrier structure 706 has a second ratio of nitrogen to metal that is different than the first ratio, and the second additional barrier structure 710 has a third ratio of nitrogen to metal that is different than the first ratio. In some embodiments, the first ratio is less than 1 and the second ratio and/or the third ratio is greater than 1.

In some embodiments, the barrier structure 114, the first additional barrier structure 706, and/or the second additional barrier structure 710 may comprise bi-layer structures (e.g., structures having more than one layer). In some embodiments, the first additional barrier structure 706 may comprise a first layer that is closer to the bottom electrode 110 and a second layer that is closer to the switching layer 112. In some embodiments, the first layer may have a lower resistivity than the second layer. In some embodiments, the second layer may comprise or be a nitride. In some embodiments, the second additional barrier structure 710 may comprise a third layer that is closer to the top electrode 118 and a fourth layer that is closer to the ion source layer 116. In some embodiments, the third layer may have a lower resistivity than the fourth layer. In some embodiments, the fourth layer may comprise or be a nitride.

Figure 8A:
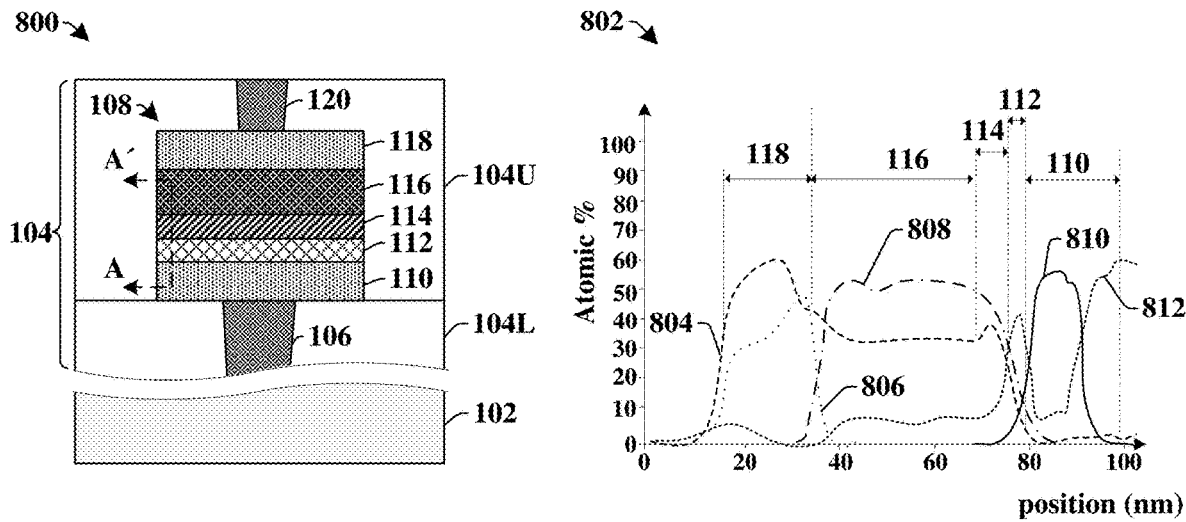
FIGS. 8A-8B illustrate some additional embodiments of an integrated chip structure comprising a CBRAM device having a barrier structure configured to reduce metal diffusion.
Figure 8B:
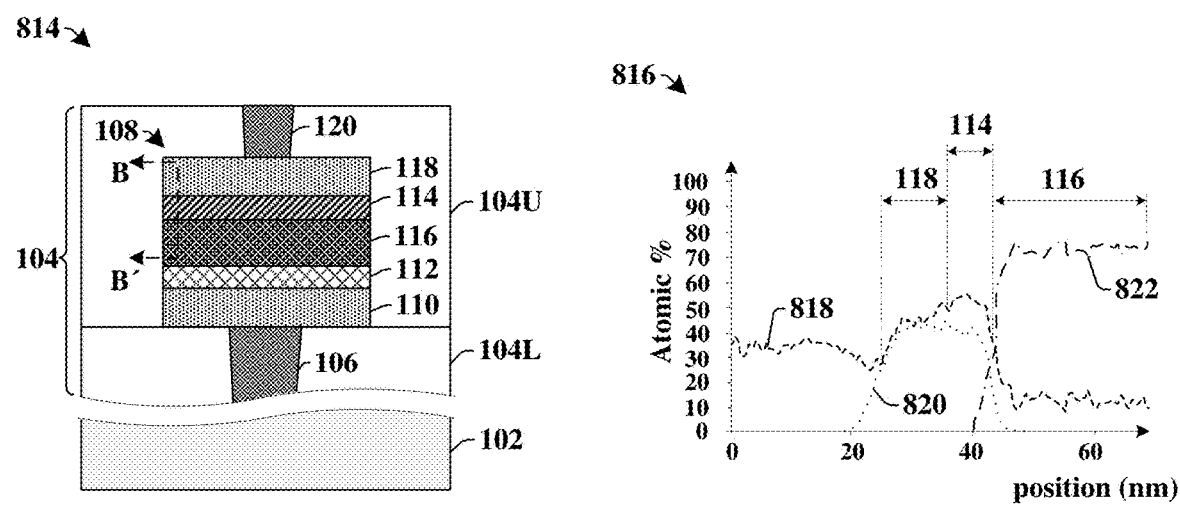

FIGS. 8A-8B illustrate some additional embodiments of an integrated chip structure comprising a CBRAM device having a barrier structure configured to reduce metal diffusion.

FIG. 8A illustrates a cross-sectional view 800 of an integrated chip comprising a CBRAM device 108 disposed within a dielectric structure 104 over a substrate 102. The CBRAM device 108 comprises a switching layer 112 and an ion source layer 116 disposed between a bottom electrode 110 and a top electrode 118. A barrier structure 114 is between the switching layer 112 and the ion source layer 116.

FIG. 8A further illustrates a graph 802 showing atomic percentages of different elements within the CBRAM device 108 as a function of position within the CBRAM device 108 (taken along line A-A' of cross-sectional view 800). Graph 802 shows an atomic percentage of nitrogen 804, an atomic percentage of titanium 806, an atomic percentage of aluminum 808, an atomic percentage of tungsten 810, and an atomic percentage of oxygen 812 over a height of the CBRAM device 108. As shown in graph 802, the atomic percentage of nitrogen 804 within the barrier structure 114 changes as a function of position. In some embodiments, the atomic percentage of nitrogen 804 within the barrier structure 114 is greater at a top surface facing the ion source layer 116 than at a bottom surface facing the switching layer 112.

In some embodiments, the atomic percentage of nitrogen 804 within the barrier structure 114 is greater than the atomic percentage of nitrogen 804 within the ion source layer 116.

In some embodiments, the atomic percentage of nitrogen 804 within the barrier structure 114 may be greater than or equal to approximately 40% while the atomic percentage of nitrogen 804 within the ion source layer 116 may be less than approximately 40% and the atomic percentage of nitrogen 804 within the switching layer 112 may be less than approximately 10%, less than approximately 5%, or other similar values. In some embodiments, the barrier structure 114 has a maximum nitrogen content that is separated by non-zero distances from a top and a bottom of the barrier structure 114. In some embodiments, the barrier structure 114 has a nitrogen content that has a maximum between a top and a bottom of the barrier structure 114 and that is asymmetric about a middle of the barrier structure 114. In some embodiments, a ratio of the atomic percentage of nitrogen 804 to the atomic percentage of aluminum 808 within the barrier structure 114 is less than 1.

FIG. 8B illustrates a cross-sectional view 814 of an integrated chip comprising a CBRAM device 108 disposed within a dielectric structure 104 over a substrate 102. The CBRAM device 108 comprises a switching layer 112 and an ion source layer 116 disposed between a bottom electrode 110 and a top electrode 118. A barrier structure 114 is disposed between the ion source layer 116 and the top electrode 118.

FIG. 8B further illustrates a graph 816 showing atomic percentages of different elements within the CBRAM device 108 as a function of position within the CBRAM device 108 (taken along line B-B' of cross-sectional view 814). Graph 816 shows an atomic percentage of nitrogen 818, an atomic percentage of titanium 820, and an atomic percentage of aluminum 822 over a height of the CBRAM device 108. As shown in graph 816, the atomic percentage of nitrogen 818 within the barrier structure 114 changes as a function of position. In some embodiments, the atomic percentage of nitrogen 818 within the barrier structure 114 is greater at an interface with the top electrode 118 than at an interface with the ion source layer 116. In some embodiments, the atomic percentage of nitrogen 818 at the interface between the barrier structure 114 and the top electrode 118 is approximately 10% or more than the atomic percentage of nitrogen 818 at the interface between the barrier structure 114 and the ion source layer 116.

In some embodiments, the atomic percentage of nitrogen 818 within the barrier structure 114 is greater than the atomic percentage of nitrogen 818 within the top electrode 118 or the ion source layer 116. In some embodiments, the atomic percentage of nitrogen 818 within the barrier structure 114 may be greater than approximately 50%, while the atomic percentage of nitrogen 818 within the top electrode 118 may be less than approximately 50% and the atomic percentage of nitrogen 818 within the ion source layer 116 may be less than approximately 20%. In some embodiments, a ratio of the atomic percentage of nitrogen 818 to the atomic percentage of titanium 820 within the barrier structure 114 is greater than 1.

Figure 9:
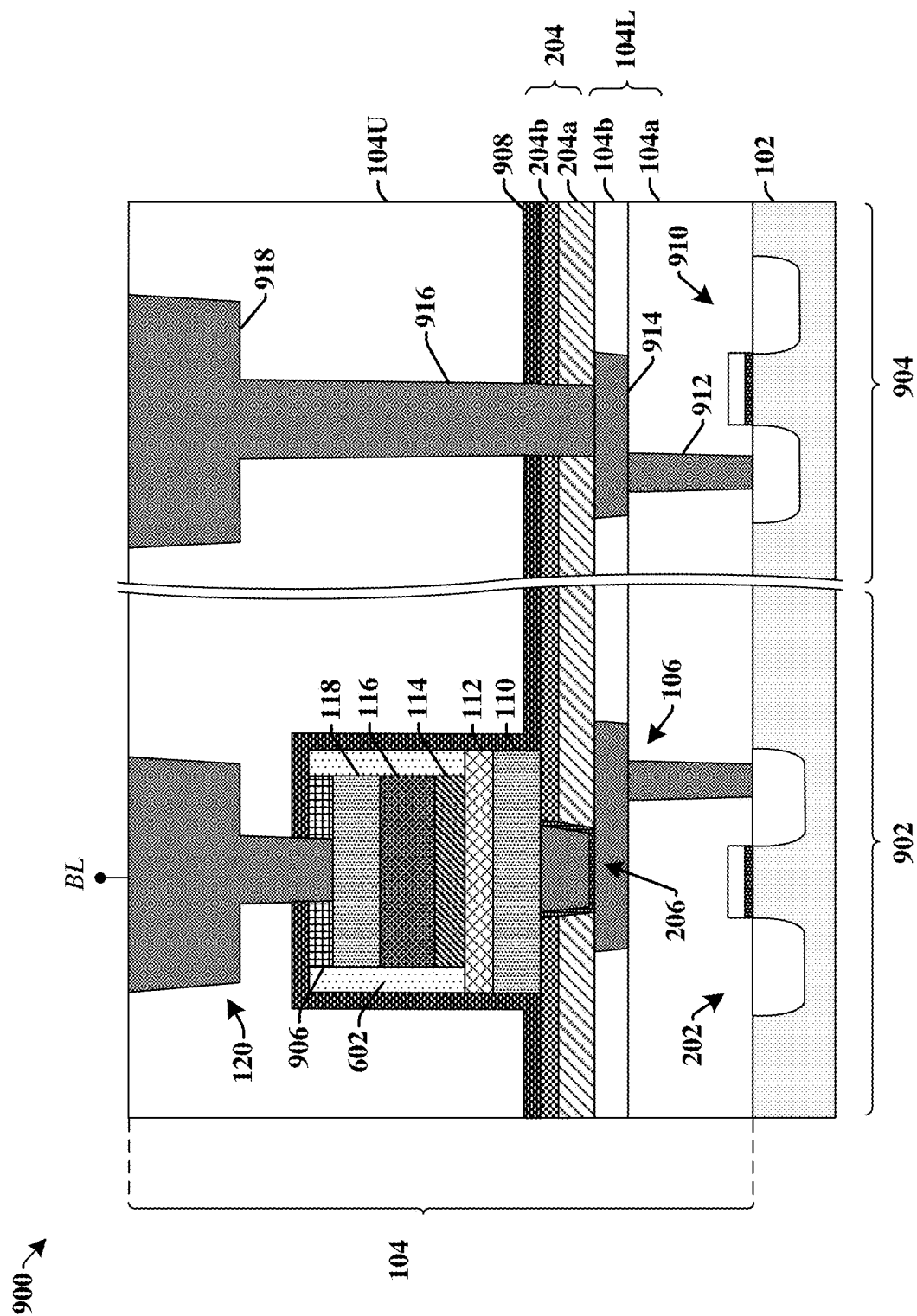
FIG. 9 illustrates a cross-sectional view of some additional embodiments of an integrated chip structure comprising a logic region and an embedded memory region that includes a CBRAM device having a barrier structure configured to reduce metal diffusion.

FIG. 9 illustrates a cross-sectional view of some additional embodiments of an integrated chip 900 comprising a CBRAM device having a disclosed barrier structure.

The integrated chip 900 comprises a substrate 102 including an embedded memory region 902 and a logic region 904. A dielectric structure 104 is arranged over the substrate 102. The dielectric structure 104 comprises a lower ILD structure 104L comprising a plurality of lower ILD layers 104a-104b. In some embodiments, two or more adjacent ones of the plurality of lower ILD layers 104a-104b may be separated by an etch stop layer (not shown). In various embodiments, the etch stop layer may comprise a nitride (e.g., silicon nitride), a carbide (e.g., silicon carbide), or the like.

The embedded memory region 902 comprises an access device 202 arranged on and/or within the substrate 102. The access device 202 is coupled to plurality of lower interconnects 106 disposed within a plurality of lower ILD layers 104a-104b. A lower insulating structure 204 is disposed over the plurality of lower ILD layers 104a-104b. In some embodiments, the lower insulating structure 204 may comprise two or more stacked dielectric layers 204a-204b.

A bottom electrode via 206 extends through the lower insulating structure 204, between one of the plurality of lower interconnects 106 and a CBRAM device 108 that overlies the lower insulating structure 204. The CBRAM device 108 is disposed within an upper ILD structure 104U on the lower insulating structure 204. In some embodiments, one or more sidewall spacers 602 are arranged on opposing sides of the CBRAM device 108. An etch stop layer 908 is arranged on the lower insulating structure 204 and extends along opposing sides of the CBRAM device 108 and the one or more sidewall spacers 602. In some embodiments, a hard mask 906 may be disposed between the top electrode 118 and a lower surface of the etch stop layer 908.

The logic region 904 comprises a transistor device 910 arranged on and/or within the substrate 102. The transistor device 910 is coupled to a plurality of interconnects 912-918 surrounded by the dielectric structure 104. In some embodiments, the plurality of interconnects 912-918 comprise a conductive contact 912 and a first interconnect wire 914 surrounded by the lower ILD structure 104L and an interconnect via 916 and a second interconnect wire 918 surrounded by the upper ILD structure 104U. In some such embodiments, the interconnect via 916 is laterally separated from the CBRAM device 108 and the second interconnect wire 918 is laterally separated from the upper interconnect structure 120. In some embodiments, the plurality of interconnects 912-918 may comprise one or more of copper, tungsten, aluminum, or the like.

FIGS. 10-19 illustrate cross-sectional views 1000-1900 showing some embodiments of a method of forming an integrated chip structure comprising a CBRAM device having a barrier structure configured to reduce a thermal diffusion of metal. Although FIGS. 10-19 are described in relation to a method, it will be appreciated that the structures disclosed in FIGS. 10-19 are not limited to such a method, but instead may stand alone as structures independent of the method.

Figure 10:
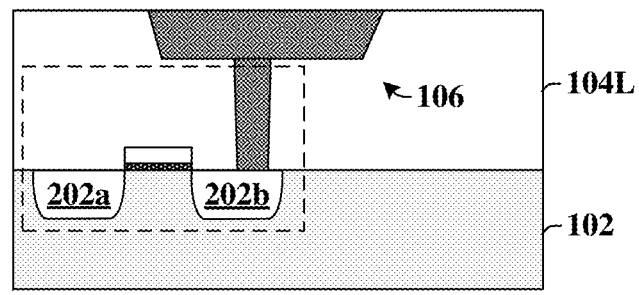
FIGS. 10-19 illustrate cross-sectional views showing some embodiments of a method of forming an integrated chip structure comprising a CBRAM device having a barrier structure configured to reduce metal diffusion.

As shown in cross-sectional view 1000 of FIG. 10, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith.

In some embodiments, one or more lower interconnects 106 may be formed within a lower ILD structure 104L formed over the substrate 102. In some embodiments, the one or more lower interconnects 106 may comprise one or more of a conductive contact, an interconnect wire, and/or an interconnect via. The one or one or more lower interconnects 106 may be formed by forming the lower ILD structure 104L over the substrate 102, selectively etching the lower ILD structure 104L to define a hole and/or a trench, forming a conductive material (e.g., copper, aluminum, etc.) within the hole and/or the trench, and performing a planarization process (e.g., a chemical mechanical planarization process) to remove excess of the conductive material from over the lower ILD structure 104L.

Figure 11:
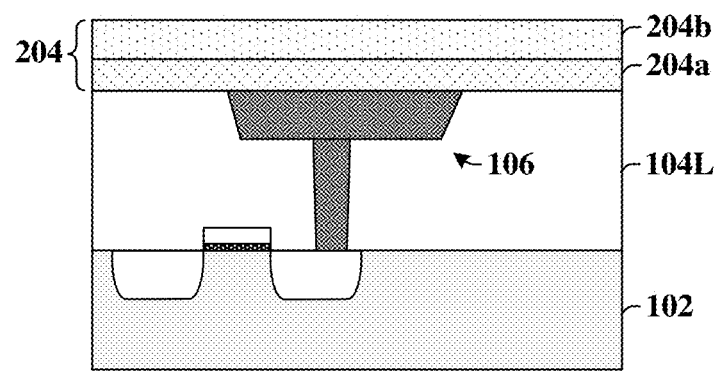

As shown in cross-sectional view 1100 of FIG. 11, a lower insulating structure 204 is formed over the lower ILD structure 104L. In some embodiments, the lower insulating structure 204 comprises a plurality of stacked dielectric layers 204a-204b. For example, in some embodiments, the lower insulating structure 204 comprises a first dielectric layer 204a and a second dielectric layer 204b over the first dielectric layer 204a. In some embodiments, the first dielectric layer 204a may comprise silicon rich oxide, silicon carbide, silicon nitride, or the like. In some embodiments, the second dielectric layer 204b may comprise silicon carbide, silicon nitride, or the like. In some embodiments, the lower insulating structure 204 may be formed by one or more deposition processes (e.g., a physical vapor deposition (PVD) process, a chemical vapor deposition (CVD) process, a plasma enhanced CVD (PE-CVD) process, or the like).

Figure 12:
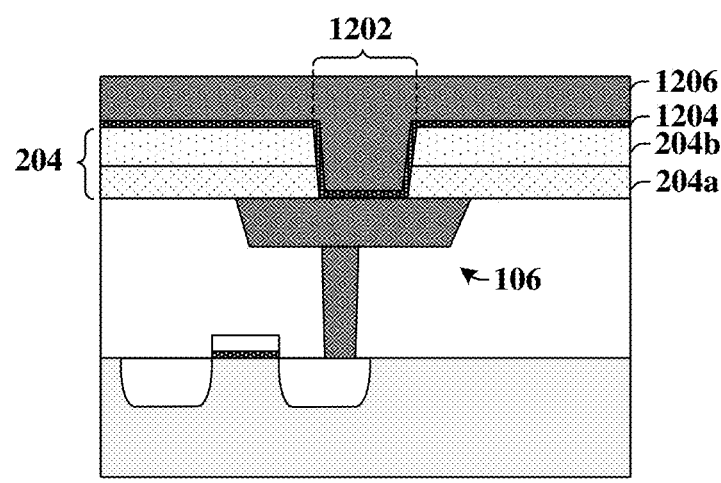

As shown in cross-sectional view 1200 of FIG. 12, the lower insulating structure 204 is selectively patterned to form an opening 1202 that extends through the lower insulating structure 204 and that exposes an upper surface of the plurality of lower interconnects 106. One or more conductive materials 1204-1206 are subsequently formed within the opening 1202 and over an upper surface of the lower insulating structure 204. In some embodiments, the one or more conductive materials 1204-1206 may comprise a diffusion barrier layer 1204 and a metal layer 1206 over the diffusion barrier layer 1204. In some embodiments, the diffusion barrier layer 1204 and the metal layer 1206 may be formed by deposition processes (e.g., a PVD process, a CVD process, a PE-CVD process, or the like).

Figure 13:
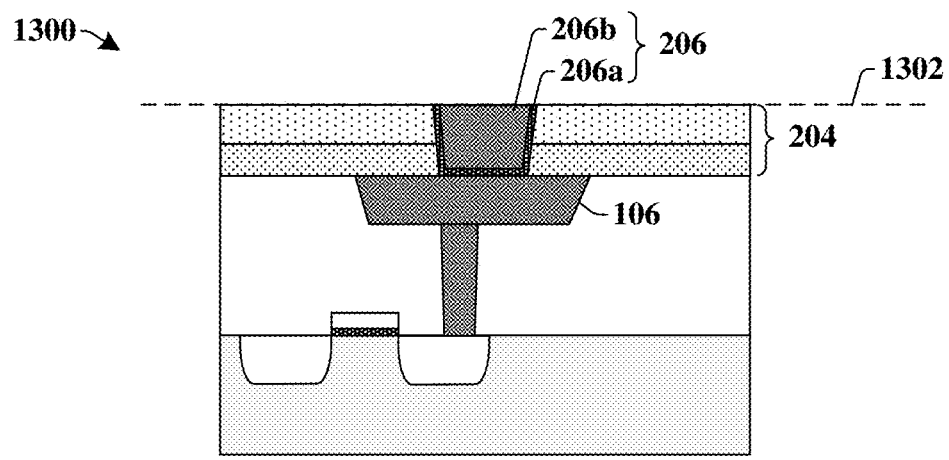

As shown in cross-sectional view 1300 of FIG. 13, parts of the one or more conductive materials (1204-1206 of FIG. 12) are removed to form a bottom electrode via 206 having a barrier layer 206a and a conductive core 206b surrounded by the barrier layer 206a. In some embodiments, the parts of the one or more conductive materials (1204-1206 of FIG. 12) are removed by way of a planarization process (e.g., a chemical mechanical planarization (CMP) process) that removes excess material of the one or more conductive materials (1204-1206 of FIG. 12) from over the lower insulating structure 204 along line 1302. In other embodiments, the parts of the one or more conductive materials (1204-1206 of FIG. 12) are removed by way of an etch back process.

Figure 14:
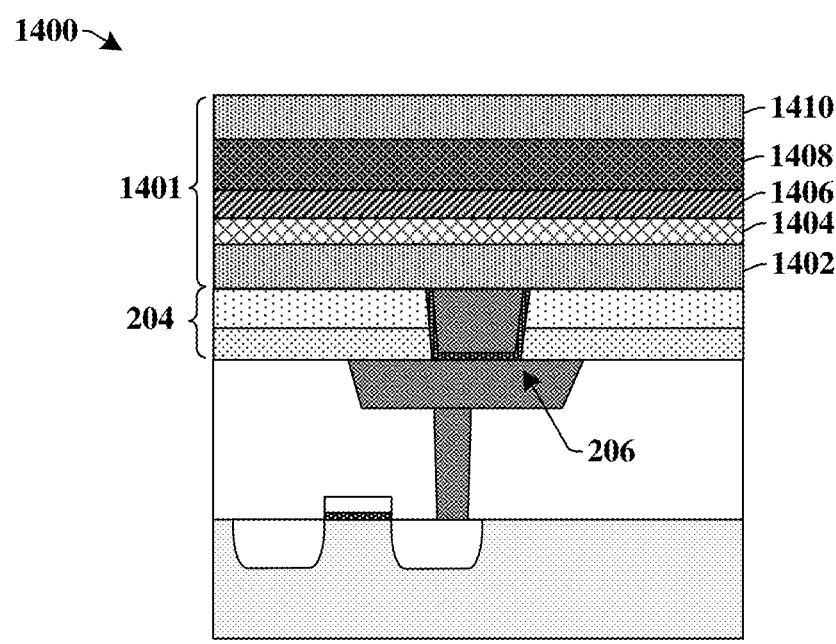

As shown in cross-sectional view 1400 of FIG. 14, a CBRAM stack 1401 is formed over the lower insulating structure 204 and the bottom electrode via 206. In some embodiments, the CBRAM stack 1401 comprises a bottom electrode layer 1402, an intermediate switching layer 1404 over the bottom electrode layer 1402, an intermediate barrier structure 1406 over the intermediate switching layer 1404, an intermediate ion source layer 1408 over the intermediate barrier structure 1406, and a top electrode layer 1410 over the intermediate ion source layer 1408. In some embodiments, the bottom electrode layer 1402, the intermediate switching layer 1404, the intermediate barrier structure 1406, the intermediate ion source layer 1408, and the top electrode layer 1410 may be formed by deposition processes (e.g., a PVD process, a CVD process, a PE-CVD process, or the like).

In other embodiments (not shown), the CBRAM stack 1401 comprises a bottom electrode layer, an intermediate switching layer over the bottom electrode layer, an intermediate ion source layer 1408 over the intermediate switching layer, an intermediate barrier structure over the ion source layer, and a top electrode layer over the intermediate barrier structure. In yet other embodiments (not shown), the CBRAM stack 1401 comprises a bottom electrode layer, an intermediate barrier structure over the bottom electrode layer, an intermediate switching layer 1404 over the intermediate barrier structure, an intermediate ion source layer over the intermediate switching layer, and a top electrode layer over the intermediate ion source layer. In yet other embodiments, the CBRAM stack 1401 may comprise any combination of the above CBRAM stacks (e.g., having intermediate barrier structures in two or more of the above disclosed places).

In some embodiments, the bottom electrode layer 1402 and/or the top electrode layer 1410 may comprise a metal, such as titanium, tantalum, titanium nitride, tantalum nitride, or the like. In some embodiments, the intermediate switching layer 1404 may comprise an oxide, a nitride, or the like. For example, in some embodiments, the intermediate switching layer 1404 may comprise silicon nitride, hafnium oxide, aluminum oxide, tantalum oxide, titanium oxide, aluminum oxide, silicon oxide, or the like. In some embodiments, the intermediate barrier structure 1406 comprises a metal nitride. For example, in various embodiments, the intermediate barrier structure 1406 may comprise titanium nitride, amorphous titanium nitride, tantalum nitride, tungsten nitride, silicon nitride, aluminum nitride, tungsten nitride, or the like. In some embodiments, the intermediate ion source layer 1408 may comprise copper, silver, aluminum, or the like. In some embodiments, the intermediate ion source layer 1408 may comprise cobalt, iron, boron, nickel, ruthenium, iridium, platinum, or the like.

Figure 15:
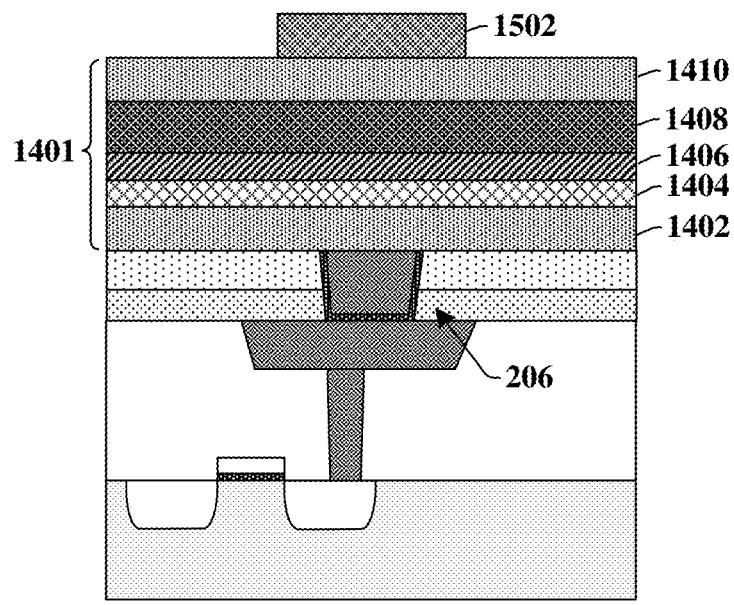

As shown in cross-sectional view 1500 of FIG. 15, a mask 1502 is formed on the CBRAM stack 1401 and directly above the bottom electrode via 206. In some embodiments, the mask 1502 may comprise a photosensitive material (e.g., photoresist). In some embodiments, the photosensitive material may be deposited by way of a spin-coating process. In other embodiments, the mask 1502 may comprise a hard mask (e.g., titanium, titanium nitride, tantalum, silicon-nitride, silicon-carbide, etc.).

Figure 16:
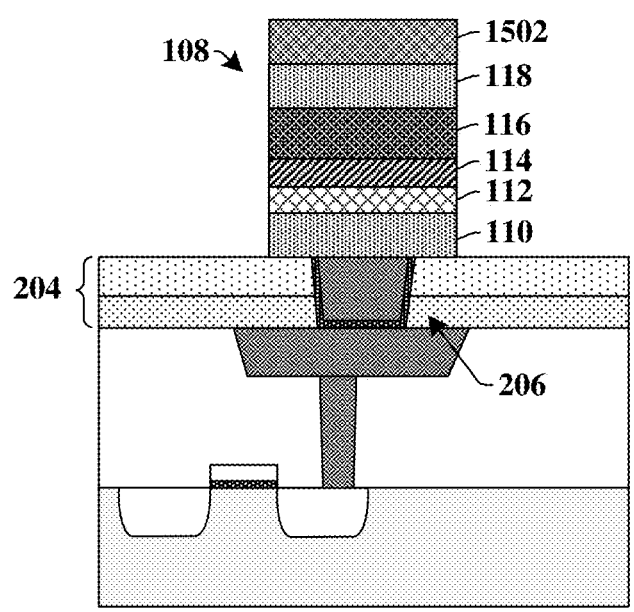

As shown in cross-sectional view 1600 of FIG. 16, an etching process is performed to selectively pattern the CBRAM stack (1401 of FIG. 15) according to the mask 1502 to form a CBRAM device 108. In some embodiments, the CBRAM device 108 comprises a switching layer 112, a barrier structure 114, and an ion source layer 116 disposed between a bottom electrode 110 and a top electrode 118. In some embodiments, the patterning process selectively exposes the CBRAM stack to a first etchant 1602 according to the mask 1502. In some embodiments, the first etchant 1602 may comprise a dry etchant (e.g., having a fluorine or chlorine based etching chemistry).

Figure 17:
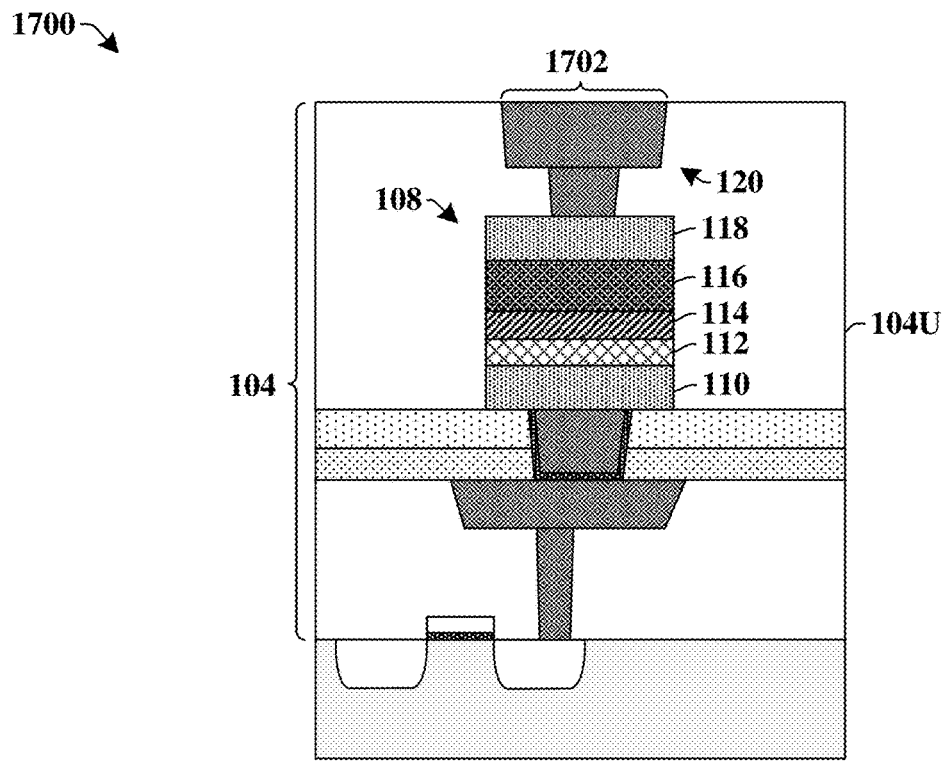

As shown in cross-sectional view 1700 of FIG. 17, an upper ILD structure 104U is formed over the CBRAM device 108. In some embodiments, the upper ILD structure 104U may be formed by a deposition process (e.g., PVD, CVD, PE-CVD, ALD, or the like). In some embodiments, the upper ILD structure 104U may comprise a nitride, a carbide, an oxide, or the like.

An upper interconnect structure 120 is formed within the upper ILD structure 104U. In some embodiments, the upper interconnect structure 120 may be formed by performing a patterning process that forms one or more openings 1702 (e.g., a via hole and/or trench) within the upper ILD structure 104U. The one or more openings 1702 extend through the upper ILD structure 104U to expose the top electrode 118. One or more conductive materials are disposed within the one or more openings 1702. A planarization process (e.g., a CMP process) is subsequently performed to remove excess of the one or more conductive materials and form the upper interconnect structure 120 within the upper ILD structure 104U. In some embodiments, the one or more conductive materials may comprise aluminum, copper, tungsten, or the like.

Figure 18:
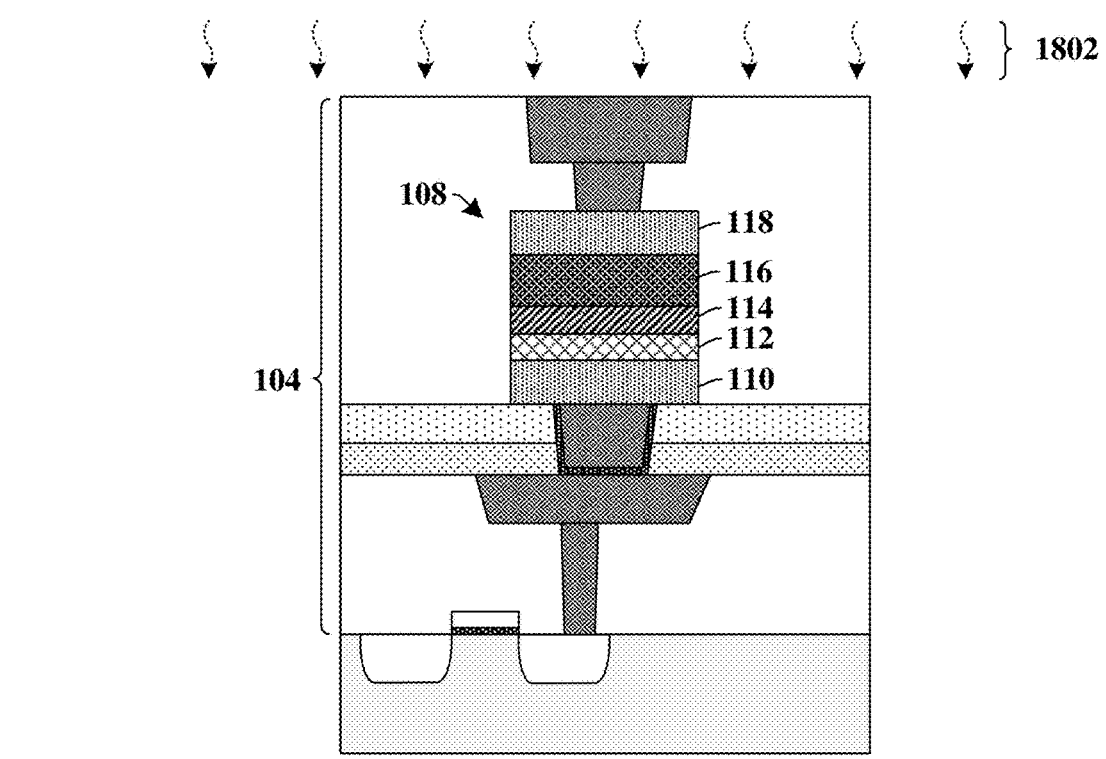

As shown in cross-sectional view 1800 of FIG. 18, a high temperature process 1802 is performed (e.g., at a temperature of greater than or equal to approximately 300° C., greater than or equal to approximately 400° C., greater than approximately 500° C., greater than or equal to approximately 750° C., or other similar values). In some embodiments, the high temperature process 1802 may be performed for a time that is greater than or equal to approximately 30 minutes, greater than or equal to approximately 60 minutes, approximately 60 minutes, or other similar values. During the high temperature process 1802, the barrier structure 114 is configured to mitigate the thermal diffusion of metal (e.g., metal ions) from the ion source layer 116 to the switching layer 112, thereby mitigating unwanted leakage between the ion source layer 116 and the switching layer 112. In some embodiments, the high temperature process 1802 may comprise a fabrication process used during fabrication of a BEOL interconnect, a FBEOL (far-back-end-of-the-line) structure, or the like. In some embodiments, the high temperature process may comprise a bonding process, a reliability testing process, a solder bump process, or other similar processes. In some embodiments, the high temperature process 1802 may be performed after forming a passivation layer over a bond pad configured to bond an integrated chip to an external integrated chip structure (e.g., another die, a printed circuit board, a package, or the like).

Figure 19:
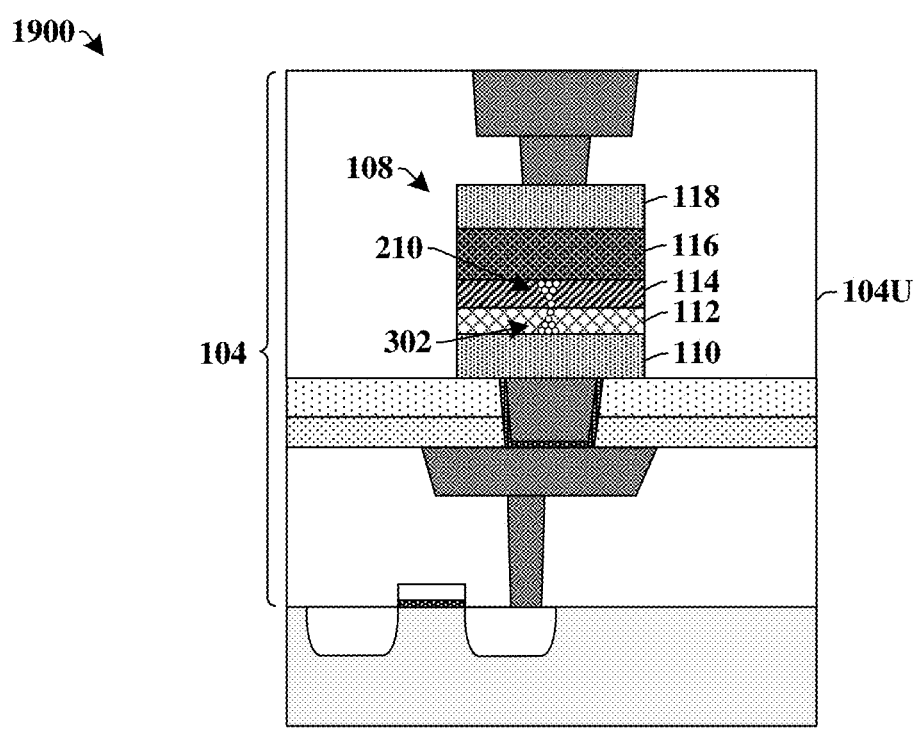

As shown in cross-sectional view 1900 of FIG. 19, a forming process is performed on the CBRAM device 108. The forming process forms a first conductive filament 210 within the barrier structure 114 and a second conductive filament 302 within the switching layer 112. In some embodiments, the forming process may be performed by applying a bias voltage across the CBRAM device 108. The bias voltage may be greater than a bias voltage used during set and/or reset operations on the CBRAM device 108.

Figure 20:
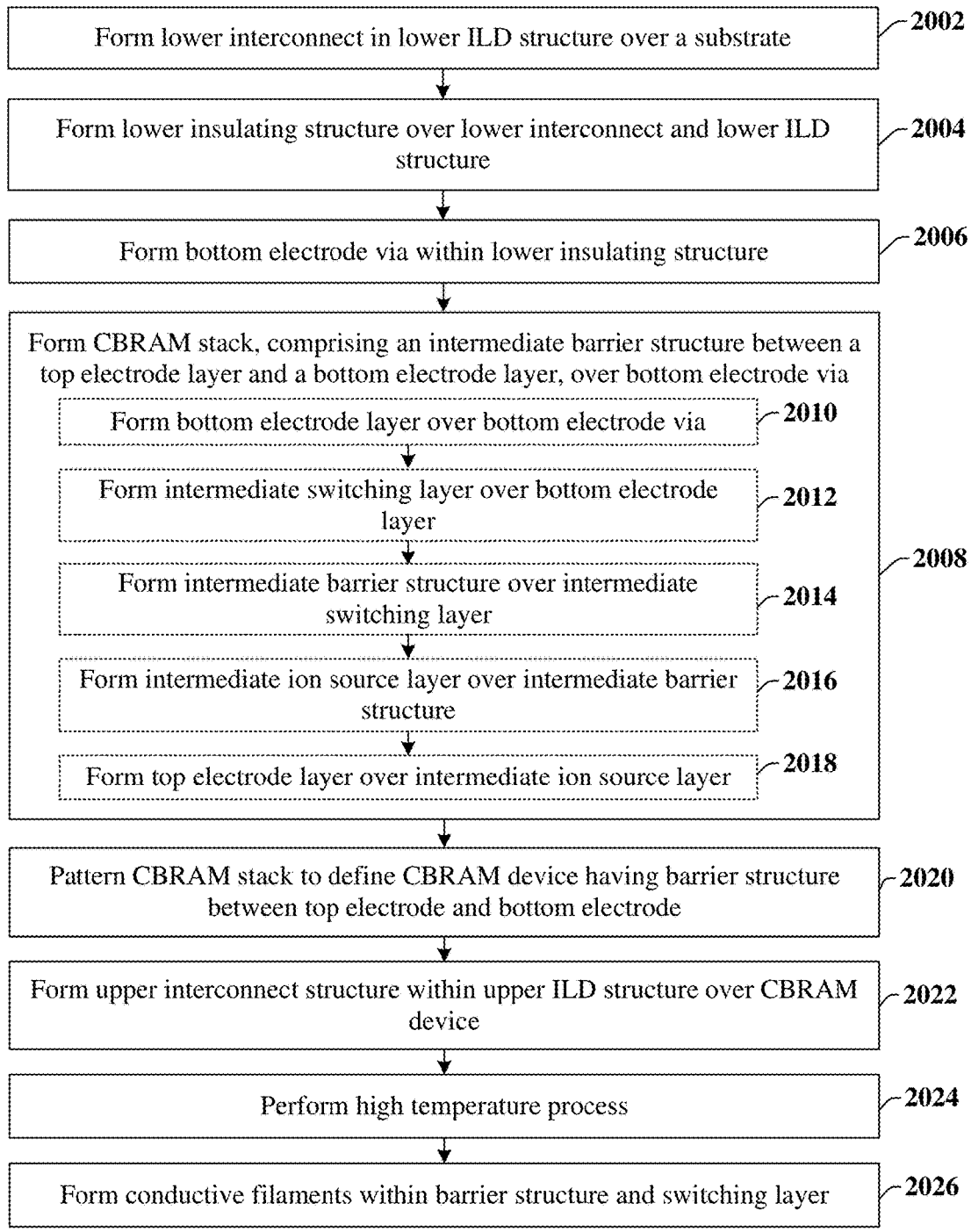
FIG. 20 illustrates a flow diagram of some embodiments of a method of forming an integrated chip structure comprising a CBRAM device having a barrier structure configured to reduce metal diffusion.

FIG. 20 illustrates a flow diagram of some embodiments of a method 2000 of forming an integrated chip structure comprising a CBRAM device having a barrier structure configured to reduce metal diffusion.

While method 2000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, a lower interconnect is formed within a lower ILD structure over a substrate. FIG. 10 illustrates a cross-sectional view 1000 of some embodiments corresponding to act 2002.

At 2004, a lower insulating structure is formed over the lower interconnect and the lower ILD structure. FIG. 11 illustrates a cross-sectional view 1100 of some embodiments corresponding to act 2004.

At 2006, a bottom electrode via is formed within the lower insulating structure. FIGS. 12-13 illustrate cross-sectional views 1200-1300 of some embodiments corresponding to act 2006.

At 2008, a CBRAM stack, comprising an intermediate barrier structure between a top electrode layer and a bottom electrode layer, is formed over the bottom electrode via. FIG. 14 illustrates a cross-sectional view 1400 of some embodiments corresponding to act 2008. In some embodiments, the CBRAM stack may be formed according to acts 2010-2018.

At 2010, a bottom electrode layer is formed over the bottom electrode via.

At 2012, an intermediate switching layer is formed over the bottom electrode layer.

At 2014, an intermediate barrier structure is formed over the intermediate switching layer.

At 2016, an intermediate ion source layer is formed over the intermediate barrier structure.

At 2018, a top electrode layer is formed over the intermediate ion source layer.

At 2020, the CBRAM stack is patterned to form a CBRAM device. The CBRAM device comprises a barrier structure arranged between a bottom electrode and a top electrode. FIGS. 15-16 illustrate cross-sectional views 1500-1600 of some embodiments corresponding to act 2020.

At 2022, an upper interconnect structure is formed within an upper ILD structure formed over the CBRAM device. FIG. 17 illustrates a cross-sectional view 1700 of some embodiments corresponding to act 2022.

At 2024, a high temperature process is performed. In some embodiments, the high temperature process may comprise a fabrication process performed at a temperature greater than approximately 400° C. FIG. 18 illustrates a cross-sectional view 1800 of some embodiments corresponding to act 2024.

At 2026, conductive filaments (e.g., conductive bridges) are formed within the barrier structure and a switching layer. FIG. 19 illustrates a cross-sectional view 1900 of some embodiments corresponding to act 2026.

Accordingly, in some embodiments, the present disclosure relates to an integrated chip structure comprising a conductive bridging random access memory (CBRAM) device having a barrier structure configured to reduce thermal diffusion of metal (e.g., metal ions) due to high temperature fabrication processes.

In some embodiments, the present disclosure relates to an integrated chip structure. The integrated chip structure includes a bottom electrode disposed within a dielectric structure over a substrate; a top electrode disposed within the dielectric structure over the bottom electrode; a switching layer between the bottom electrode and the top electrode; an ion source layer disposed between the bottom electrode and the top electrode; and a barrier structure disposed between the bottom electrode and the top electrode, the barrier structure having a metal nitride configured to mitigate a thermal diffusion of metal during a high temperature fabrication process. In some embodiments, the barrier structure is disposed between the switching layer and the ion source layer. In some embodiments, the integrated chip structure further includes a first additional barrier structure arranged between a bottom of the switching layer and a top of the bottom electrode; and a second additional barrier structure arranged between a top of the ion source layer and a bottom of the top electrode. In some embodiments, the barrier structure includes a gradient nitrogen content that continuously varies between a first nitrogen content along a bottom surface of the barrier structure and a second nitrogen content along a top surface of the barrier structure, the second nitrogen content being higher than the first nitrogen content. In some embodiments, the barrier structure has a maximum nitrogen content that is separated by non-zero distances from the top surface and the bottom surface of the barrier structure. In some embodiments, the barrier structure includes a first barrier layer having a first nitrogen content along a bottom surface of the barrier structure and a second barrier layer having a second nitrogen content along a top surface of the barrier structure, the second nitrogen content being discontinuous with the first nitrogen content. In some embodiments, the barrier structure includes titanium nitride, tantalum nitride, aluminum nitride, silicon nitride, or tungsten nitride. In some embodiments, the barrier structure is arranged between a top of the ion source layer and a bottom of the top electrode. In some embodiments, the integrated chip structure further includes an additional barrier structure including an additional metal nitride arranged between the ion source layer and the top electrode, the barrier structure and the additional barrier structure having different contents of nitrogen.

In other embodiments, the present disclosure relates to an integrated chip structure. The integrated chip structure includes a conductive bridging random access memory (CBRAM) device disposed over a substrate, the CBRAM device including a switching layer disposed between a first electrode and a second electrode; an ion source layer disposed between the switching layer and the second electrode; and a barrier structure disposed between the switching layer and the ion source layer, the barrier structure being configured to mitigate a thermal diffusion of metal between the switching layer and the ion source layer. In some embodiments, a first conductive filament extends through the barrier structure during storage of a first data state and a second data state; and a second conductive filament is configured to extend through the switching layer during storage of the first data state but not during storage of the second data state. In some embodiments, the barrier structure has a ratio of nitrogen to aluminum that is between approximately 40% and approximately 70%. In some embodiments, the barrier structure includes a nitrogen content that has a maximum between a top and a bottom of the barrier structure and that is asymmetric about a middle of the barrier structure. In some embodiments, the integrated chip structure further includes a first additional barrier structure arranged between a bottom of the switching layer and a top of the first electrode, the barrier structure having a first ratio of nitrogen to metal that is less than 1 and the first additional barrier structure having a second ratio of nitrogen to metal that is greater than 1. In some embodiments, the barrier structure includes silicon nitride, aluminum nitride, or tungsten nitride. In some embodiments, the barrier structure has a thickness that is less than approximately 50 Angstroms. In some embodiments, the barrier structure includes a first barrier layer having a first gradient nitrogen content and a second barrier layer having a second gradient nitrogen content that is discontinuous with the first gradient nitrogen content. In some embodiments, the barrier structure has a first non-zero atomic percentage of nitrogen that is greater than approximately 50% and the ion source layer has a second non-zero atomic percentage of nitrogen that is less than approximately 20%.

In yet other embodiments, the present disclosure relates to a method for forming an integrated chip structure. The method includes forming a lower interconnect within a lower inter-level dielectric (ILD) structure over a substrate; forming a conductive bridging random access memory (CBRAM) stack on the lower ILD structure and the lower interconnect; patterning the CBRAM stack according to a mask to form a CBRAM device having a switching layer and an ion source layer between a first electrode and a second electrode, a barrier structure is also disposed between the first electrode and the second electrode; and forming an upper interconnect within an upper ILD structure over the CBRAM device, the upper interconnect coupled to the second electrode. In some embodiments, the method further includes performing a high temperature process at a temperature of greater than 400° C. after patterning the CBRAM stack, the barrier structure being configured to mitigate a thermal diffusion of metal ions from the ion source layer to the switching layer during the high temperature process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip structure, comprising:
   forming a lower interconnect within a lower inter-level dielectric (ILD) structure over a substrate;
   forming a conductive bridging random access memory (CBRAM) stack on the lower ILD structure and the lower interconnect;
   patterning the CBRAM stack according to a mask to define a CBRAM device comprising a switching layer and an ion source layer between a first electrode and a second electrode, wherein a barrier structure is also disposed between the first electrode and the second electrode;
   forming an upper interconnect within an upper ILD structure over the CBRAM device, the upper interconnect coupled to the second electrode; and
   wherein the barrier structure is a same material continuously extending between a topmost surface contacting the ion source layer and a bottommost surface contacting the switching layer and wherein the barrier structure has a profile of nitrogen atomic percentage that varies as a continuous function between the bottommost surface and the topmost surface of the barrier structure.

2. The method of claim 1, wherein the profile of nitrogen atomic percentage monotonically and consistently increases from the bottommost surface to a peak concentration.

3. A method of forming an integrated chip structure, comprising:
   forming a bottom electrode layer over a substrate;
   forming an intermediate switching layer over the bottom electrode layer;
   forming an intermediate barrier structure over the intermediate switching layer, wherein the intermediate barrier structure comprises a metal nitride;
   forming an intermediate ion source layer over the intermediate barrier structure;

forming a top electrode layer over the intermediate ion source layer;

patterning the top electrode layer, the intermediate ion source layer, the intermediate barrier structure, the intermediate switching layer, and the bottom electrode layer to form a memory device; and wherein the intermediate barrier structure has a profile of nitrogen atomic percentage that increases from a first non-zero percentage to a peak of a second percentage and decreases to a third non-zero percentage lower than the first non-zero percentage.

4. The method of claim 3, wherein the intermediate barrier structure comprises a metal along a surface facing away from the intermediate ion source layer, a part of the intermediate ion source layer comprising the metal and further comprising a second metal that is different than the metal.

5. The method of claim 3, further comprising:

performing a high temperature process after patterning the top electrode layer, the high temperature process being performed at a temperature of greater than 300° C.; and wherein the metal nitride of the intermediate barrier structure is configured to mitigate a thermal diffusion of metal during the high temperature process.

6. The method of claim 3, wherein the intermediate barrier structure has a profile of metal atomic percentage that continuously increases from a fourth percentage to a peak of a fifth percentage, the fifth percentage being vertically between the fourth percentage and the intermediate ion source layer.

7. The method of claim 6, wherein the intermediate barrier structure has a maximum nitrogen content that is separated by non-zero distances from a top surface and a bottom surface of the intermediate barrier structure.

8. The method of claim 3, wherein the intermediate barrier structure comprises titanium nitride, tantalum nitride, aluminum nitride, silicon nitride, or tungsten nitride.

9. The method of claim 3, wherein a second atomic percentage of nitrogen within the intermediate ion source layer varies over a height of the intermediate ion source layer.

10. A method of forming an integrated chip structure, comprising:

forming a bottom electrode layer over a substrate;

forming an intermediate switching layer over the bottom electrode layer;

forming an intermediate barrier structure over the bottom electrode layer, wherein the intermediate barrier structure comprises a metal having a gradient nitrogen content;

forming an intermediate ion source layer over the bottom electrode layer, wherein the intermediate barrier structure separates the intermediate ion source layer from the intermediate switching layer;

forming a top electrode layer over the intermediate barrier structure, the intermediate ion source layer, and the intermediate switching layer;

patterning the top electrode layer, the intermediate barrier structure, the intermediate ion source layer, the intermediate switching layer, and the bottom electrode layer; and wherein the intermediate barrier structure has a first non-zero atomic percentage of nitrogen that is greater than 50% and the intermediate ion source layer has a second non-zero atomic percentage of nitrogen that is less than 20%.

11. The method of claim 10, wherein the intermediate barrier structure continuously extends from a first surface contacting the intermediate ion source layer to a second surface contacting the intermediate switching layer, after forming the top electrode layer.

12. The method of claim 10, wherein the intermediate barrier structure is formed over a top of the intermediate switching layer.

13. The method of claim 10, wherein a first conductive filament is configured to extend through the intermediate barrier structure during storage of a first data state and a second data state; and wherein a second conductive filament is configured to extend through the intermediate switching layer during storage of the first data state but not during storage of the second data state.

14. The method of claim 10, wherein a part of the intermediate ion source layer comprises nitrogen, oxygen, a first metal, and a second metal that is different than the first metal.

15. The method of claim 10, wherein the intermediate barrier structure has a maximum nitrogen content that is between a top and a bottom of the intermediate barrier structure and that is asymmetric about a middle of the intermediate barrier structure.

16. The method of claim 10, wherein the intermediate barrier structure comprises silicon nitride, aluminum nitride, or tungsten nitride.

17. The method of claim 10, wherein the intermediate barrier structure is formed to have a thickness that is less than 50 Angstroms.

18. The method of claim 10, wherein the intermediate barrier structure has a first non-zero minimum atomic percentage of nitrogen and the intermediate ion source layer has a second non-zero minimum atomic percentage of nitrogen, the first non-zero minimum atomic percentage of nitrogen being lower than the second non-zero minimum atomic percentage of nitrogen.

19. The method of claim 10, wherein the intermediate barrier structure has a higher concentration of the metal at a peak of concentration of nitrogen than along a bottommost surface of the intermediate barrier structure.

20. The method of claim 10, wherein the intermediate barrier structure has a first nitrogen concentration along a first surface facing the intermediate ion source layer and a second nitrogen concentration along a second surface facing away from the intermediate ion source layer, the first nitrogen concentration being larger than the second nitrogen concentration.

* * * * *